(12) United States Patent
Sasaki et al.

(10) Patent No.: US 10,749,083 B2
(45) Date of Patent: Aug. 18, 2020

(54) METHOD FOR ENCAPSULATING EMISSIVE ELEMENTS FOR FLUIDIC ASSEMBLY

(71) Applicant: eLux Inc., Vancouver, WA (US)

(72) Inventors: Kenji Sasaki, West Lynn, OR (US); Paul J. Schuele, Washougal, WA (US)

(73) Assignee: eLux Inc., Vancouver, WA (US)

( * ) Notice: Subject to any disclaimer, the term of this patent is extended or adjusted under 35 U.S.C. 154(b) by 0 days.

(21) Appl. No.: 16/693,674

(22) Filed: Nov. 25, 2019

(65) Prior Publication Data

US 2020/0091383 A1    Mar. 19, 2020

Related U.S. Application Data

(60) Division of application No. 16/125,671, filed on Sep. 8, 2018, now Pat. No. 10,516,084, which is a
(Continued)

(51) Int. Cl.
*H01L 33/54* (2010.01)
*H01L 27/15* (2006.01)
(Continued)

(52) U.S. Cl.
CPC ............ *H01L 33/54* (2013.01); *H01L 21/561* (2013.01); *H01L 21/6835* (2013.01); *H01L 23/3185* (2013.01); *H01L 24/97* (2013.01); *H01L 25/0753* (2013.01); *H01L 27/156* (2013.01); *H01L 33/58* (2013.01); *H01L 33/62* (2013.01); *H01L 24/03* (2013.01); *H01L 24/11* (2013.01);
(Continued)

(58) Field of Classification Search
CPC ..... H01L 25/50; H01L 27/153; H01L 33/007; H01L 2224/75655; H01L 2224/76733; H01L 2224/95144
See application file for complete search history.

(56) References Cited

U.S. PATENT DOCUMENTS 5,783,856 A * 7/1998 Smith .................. G02F 1/1362
257/618
6,780,696 B1 * 8/2004 Schatz .................... H01L 24/95
257/688
(Continued)

*Primary Examiner* — Sitaramarao S Yeschuri
(74) *Attorney, Agent, or Firm* — Law Office of Gerald Maliszewski; Gerald Maliszewski

(57) ABSTRACT

A method is provided for fabricating an encapsulated emissive element. Beginning with a growth substrate, a plurality of emissive elements is formed. The growth substrate top surface is conformally coated with an encapsulation material. The encapsulation material may be photoresist, a polymer, a light reflective material, or a light absorbing material. The encapsulant is patterned to form fluidic assembly keys having a profile differing from the emissive element profiles. In one aspect, prior to separating the emissive elements from the handling substrate, a fluidic assembly keel or post is formed on each emissive element bottom surface. In one variation, the emissive elements have a horizontal profile. The fluidic assembly key has horizontal profile differing from the emissive element horizontal profile useful in selectively depositing different types of emissive elements during fluidic assembly. In another aspect, the emissive elements and fluidic assembly keys have differing vertical profiles useful in preventing detrapment.

19 Claims, 20 Drawing Sheets

Related U.S. Application Data continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, which is a continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, and a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(51) Int. Cl.

| | | |
|---|---|---|
| *H01L 33/62* | (2010.01) |
| *H01L 21/683* | (2006.01) |
| *H01L 21/56* | (2006.01) |
| *H01L 23/31* | (2006.01) |
| *H01L 33/58* | (2010.01) |
| *H01L 25/075* | (2006.01) |
| *H01L 23/00* | (2006.01) |
| *H01L 33/32* | (2010.01) |
| *H01L 33/60* | (2010.01) |
| *H01L 33/20* | (2010.01) |

(52) U.S. Cl.
CPC .............. *H01L 24/13* (2013.01); *H01L 24/81* (2013.01); *H01L 33/20* (2013.01); *H01L 33/32* (2013.01); *H01L 33/60* (2013.01); *H01L 2221/68354* (2013.01); *H01L 2224/04105* (2013.01); *H01L 2224/95101* (2013.01); *H01L 2224/95136* (2013.01); *H01L 2224/95143* (2013.01); *H01L 2924/10156* (2013.01); *H01L 2924/10157* (2013.01); *H01L 2924/15156* (2013.01); *H01L 2924/15157* (2013.01); *H01L 2933/005* (2013.01)

(56) References Cited

U.S. PATENT DOCUMENTS

| | | | | |
|---|---|---|---|---|
| 2006/0220988 A1* | 10/2006 | Hillis | .................... | G09G 3/001 345/30 |
| 2006/0278886 A1* | 12/2006 | Tomoda | .................. | H01L 33/20 257/99 |
| 2010/0075463 A1* | 3/2010 | Smith | .................... | G02F 1/1362 438/118 |
| 2013/0214302 A1* | 8/2013 | Yeh | .......................... | H01L 33/48 257/88 |
| 2016/0380158 A1* | 12/2016 | Sasaki | ..................... | H01L 24/95 257/89 |

* cited by examiner

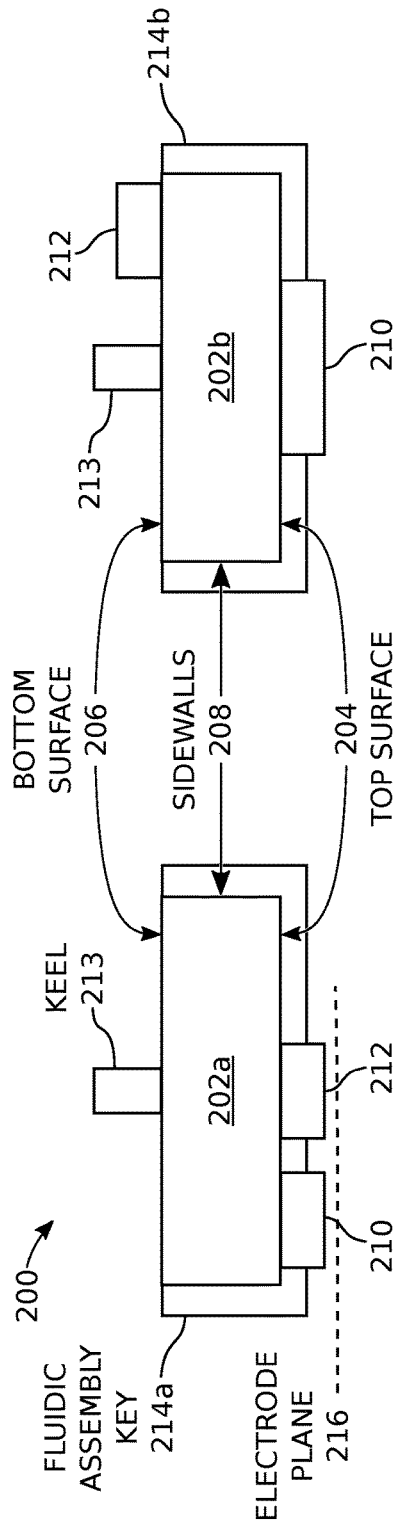
Fig. 2A
Fig. 2B
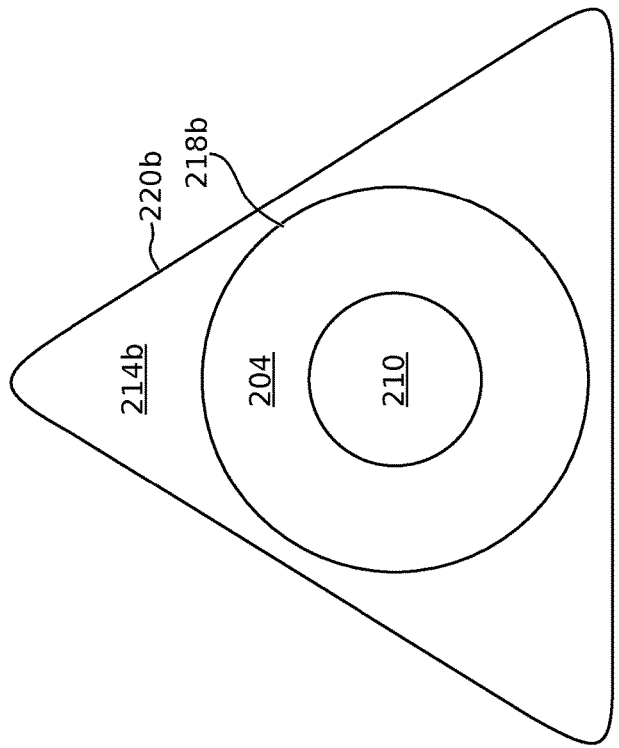
Fig. 2D
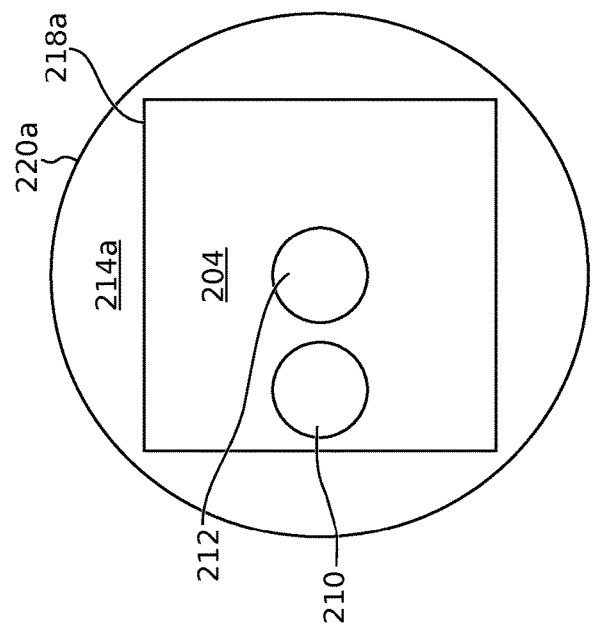
Fig. 2C

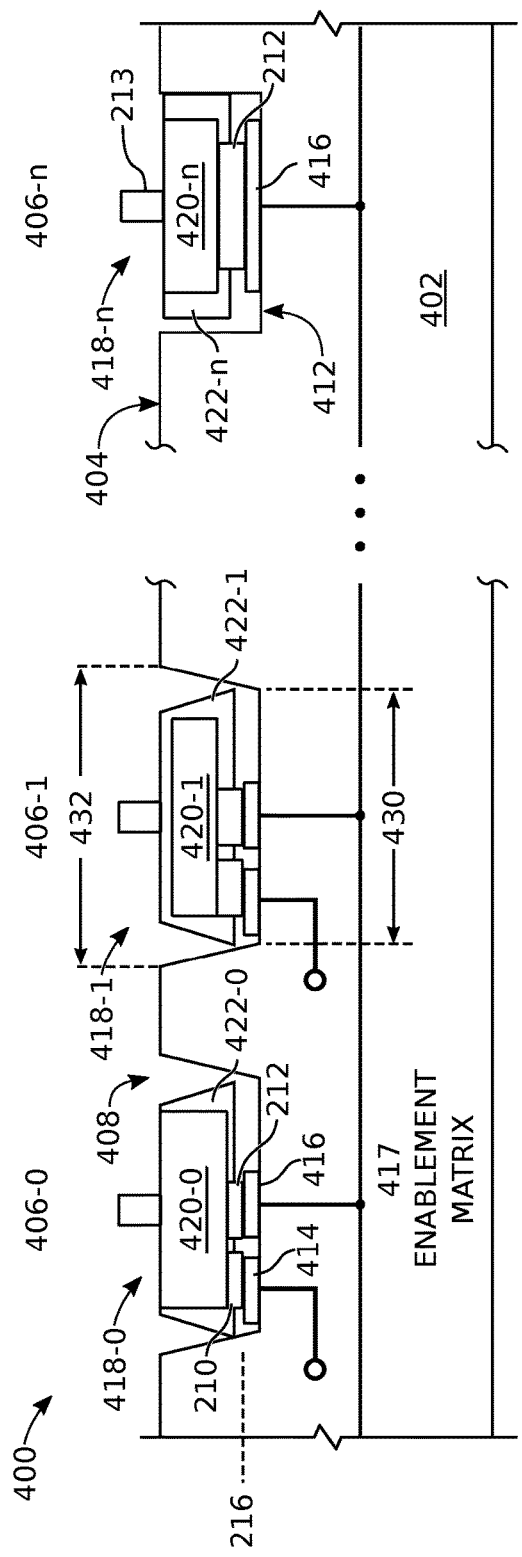
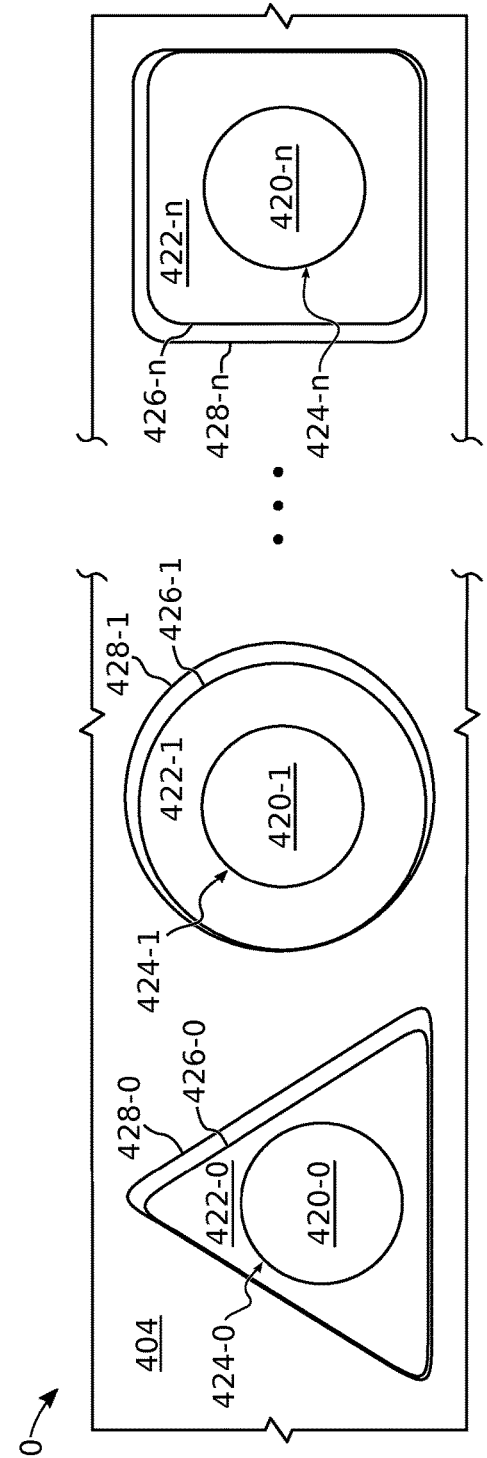
Fig. 4A
Fig. 4B

METHOD FOR ENCAPSULATING EMISSIVE ELEMENTS FOR FLUIDIC ASSEMBLY

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to visual display technology and, more particularly, to a visual display substrate made from partially encapsulated emissive elements developed for fluidic assembly.

2. Description of the Related Art

A color display is composed of pixels that emit light at three wavelengths corresponding to the visible colors red (R), green (G), and blue (B), which is referred to as an RGB display. The RGB components of the pixel are turned on and off in a systematic way to additively produce the colors of the visible spectrum. There are several display types that produce the RGB images in different ways. Liquid crystal displays (LCD) are the most prevalent technology and they produce RGB images by shining a white light source, typically a phosphor produced white light emitting diode (LED), through a color filter of a subpixel. Some portion of the white light wavelengths is absorbed and some transmitted through the color filter. The weaknesses of LCD, which the current disclosure directly addresses, are 1) low efficiency where only about 5% of the light generated by the backlight is seen as an image by the user, and 2) low dynamic range because the LC material cannot completely block light to produce a black pixel.

Organic light emitting diode (OLED) displays produce RGB light by direct emission of each of those wavelengths of light at a pixel level within the organic light emitting material. The weaknesses of the OLED display are poor reliability and low efficiency (~5% QE) of the blue OLED material.

A third display technology is the micro-LED display. This display technology uses micro-sized (10 to 150 μm diameter) inorganic LEDs for direct emission of light at the pixel level. In order to make an RGB display using micro-LEDs it is necessary to assemble large area arrays of three different micro-LEDs that emit in each of the RGB range of wavelengths. The low-cost manufacture of micro-LED displays requires the use of a massively parallel assembly technique to position millions of individual micro-LEDs in regular arrays.

As used herein, a micro-LED (uLED) is an LED with a diameter or cross-sectional area of 100 microns or less. Both organic and inorganic LED displays have a very high contrast because black pixels are set to emit no light. For an inorganic uLED display, blue gallium nitride (GaN) LEDs have a 35-40% quantum efficiency, with a reliability of over 50,000 hours, as has been established in general lighting. Sony has developed a passive matrix of uLEDs arranged in a display array using a pick-and-place system. However, since large displays require millions of LEDs, displays made by this process are time and cost prohibitive compared to other technologies. Mass transfer technologies use finely pitched stamps to deposit multiple LEDs simultaneously, but this method is only practical for small area devices (e.g., a watch) because the spacing between LEDs is fixed by the growth substrate.

The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size LED micro structures, such as rods, fins or disks, can be first fabricated on small size wafers and then be transferred to a large area glass substrate to make a direct emitting display requiring no backlighting. An example of this technology is presented in U.S. Pat. No. 9,825,202 and Ser. No. 15/412,731, which are incorporated herein by reference.

FIG. 1 is an artist's rending of an optical micrograph of triangular gallium nitride micro-LEDs with a 40 micron (μm) base fractured during laser-liftoff. High speed assembly is necessarily higher energy, and as a consequence of the stochastic nature of massively parallel fluidic assembly, component collisions are numerous, difficult to control, and can easily damage unprotected microcomponents, especially along the gallium nitride crystal planes. Such damage may deactivate the microcomponent, resulting in an unusable assembled substrate, but there is also a significant risk that the damage results in fractured pieces that spread and cause defects in a plurality of sites. If a small particle is deposited in a trap site before a micro-LED is assembled, then the particle can prevent the micro-LED from contacting the electrodes in the bottom of the trap site. It is therefore critical that microcomponents used for fluidic assembly are structurally robust enough to undergo the many collisions in fluidic assembly without damage. Micro-LEDs in fluidic assembly are particularly susceptible to fracture as epitaxial layers are generally thin (i.e., under 10 microns), while the emitter width is generally greater than 20 microns. Also, certain material systems, such as gallium arsenide (GaAs) are particularly susceptible to fracture. Non-circular shapes, such as shown in FIG. 1 are also more easily fractured.

Further, a major challenge for manufacturing emissive displays via fluidic assembly is the rapid and high yield assembly of three types of emitter such as red-emitting microcomponents, green-emitting microcomponents, and blue-emitting microcomponents. A particular challenge for multi-emitter assembly is simultaneously optimizing the assembly characteristics as well as the emitter characteristics that are necessary for the production of a high-quality display, while preventing defects from cross-contamination and component damage.

It would be advantageous if micro-LEDs could be packaged in a protective coating during assembly to prevent damage.

It would also be advantageous if the packaged micro-LEDs could be shaped to promote self-assembly in targeted regions of a substrate.

It would be even more advantageous if shape-packaged micro-LEDs could be used during fluidic assembly to coordinate the alignment of particular LED colors into specific subpixel positions on a display substrate.

SUMMARY OF THE INVENTION

Disclosed herein is an emissive substrate made from fluidically assembled composite emissive elements, which may be semiconductor-based inorganic micro-LEDs that are at least partially encapsulated in another material, such as a patternable polymer (e.g., SU8). The result is the decoupling of fluidic assembly, which is primarily mediated by the interaction of the polymer encapsulant structure with the fluidic assembly forcing and trapping sites (wells) in the substrate, from the emissive element, which may be processed and structured to optimize emissive characteristics such as efficiency, color, emission area, and electrical contacts, but which may have non-optimal fluidic assembly characteristics. The emissive element may be an inorganic emitter such as a gallium nitride (GaN) or gallium arsenide (GaAs)-based micro-LED, with a patternable polymer encapsulant that protects the emitter from collisions and subsequent damage during fluidic assembly. The encapsulation protects the emitting micro-LED and creates greater control over the shapes critical to efficient assembly—both of which enable higher speed assembly and fewer defective arrays. The encapsulation material may optionally serve additional functions such as electrical passivation between micro-LED cathode and anode or light management by absorbing or reflecting light.

Accordingly, an exemplary method is provided for fabricating an encapsulated emissive element. Beginning with a growth substrate, a plurality of emissive elements is formed. Each emissive element has a bottom surface attached to a top surface of the growth substrate, a top surface, and a profile. The growth substrate top surface is conformally coated with an encapsulation material. The encapsulation material may be photoresist, a polymer, a light reflective material, a light absorbing material, or a magnetic material. The encapsulant is patterned to form fluidic assembly keys having a profile differing from the emissive element profiles. Simultaneously, at least one contact opening is made to each emissive element top surface. In the case of a surface mount emissive element, two contact openings are made. Then, a first electrical contact is made to each emissive element top surface. In the case of a surface mount emissive element, two electrical contacts are made. The emissive element top surfaces are bonded to a handling substrate. Once bonded to the handling substrate, the emissive elements can be separated from the growth substrate, and finally, the emissive elements are separated from the handling substrate. In one aspect, prior to separating the emissive elements from the handling substrate, a fluidic assembly keel or post is formed on each emissive element bottom surface. Note: the emissive element top surface is defined as the surface formed adjacent the growth substrate during fabrication, as described in detail below.

In one variation, the emissive element top surfaces are substantially planar in a horizontal orientation, and they have a horizontal profile. The fluidic assembly key has horizontal profile differing from the emissive element horizontal profile, as defined from a vantage orthogonal to the emissive element top surface. For example, a first fluidic assembly key horizontal profile may be associated with an emissive element capable of emitting a first wavelength of light. In fact, the method may form a plurality of emissive element types (not necessarily simultaneously), with each type capable of emitting light at a different wavelength. Then, the fluidic assembly keys can be formed in a plurality of different horizontally oriented shapes, with each horizontally oriented shape associated with a corresponding emissive element wavelength of light emission. Alternatively, the fluidic assembly keys may be formed in a plurality of different vertically oriented shapes, with each vertically oriented shape associated with a corresponding emissive element wavelength of light emission. A vertical profile is defined from the vantage orthogonal to an emissive element sidewall. For example, if the different emissive element types have differing thicknesses, the thicknesses of the corresponding fluidic assembly keys can be made to compensate, to produce encapsulated emissive elements all having a uniform thickness.

In another aspect, the emissive elements have a vertical profile and the fluidic assembly vertical profiles differ from the emissive element vertical profiles. For example, the fluidic assembly key vertical profiles may have a slope formed between a fluidic assembly key bottom surface aligned with the emissive element bottom surface, and a fluidic assembly key top surface aligned with the emissive element top surface. The fluidic assembly key top surface width being greater than or equal to the fluidic assembly key bottom surface width. Also, the emissive element top and bottom surfaces may be substantially planar in a horizontal orientation, with emissive element sidewalls forming a vertically oriented slope between an emissive element top surface width less than or equal to an emissive element bottom surface width.

Additional details of the above-described method, an encapsulated emissive element device, and a display made using encapsulated emissive elements are provided below.

BRIEF DESCRIPTION OF THE DRAWINGS

FIGS. 2A and 2B are partial cross-sectional views of encapsulated emissive elements and FIGS. 2C and 2D are plan (top) views of the encapsulated emissive elements.

FIGS. 4A and 4B are, respectively, partial cross-sectional and plan views of a fluidic assembly emissive display.

FIGS. 11A through 11I1 depict an exemplary process flow for the partial encapsulation of surface mount configuration composite microcomponents after release from a growth substrate.

DETAILED DESCRIPTION

Figures 3A, 3B:
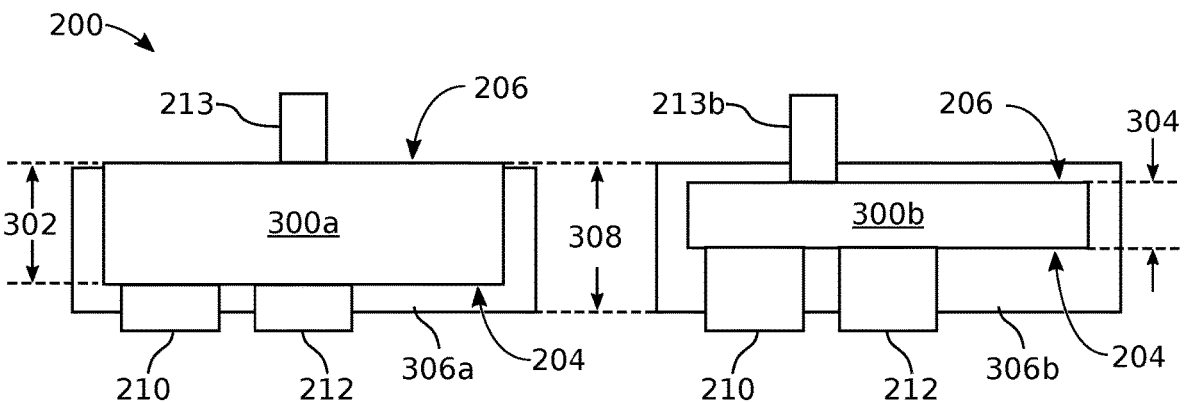
FIGS. 3A through 3D are partial cross-sectional views of encapsulated emissive element vertical profiles.
Figure 3C:
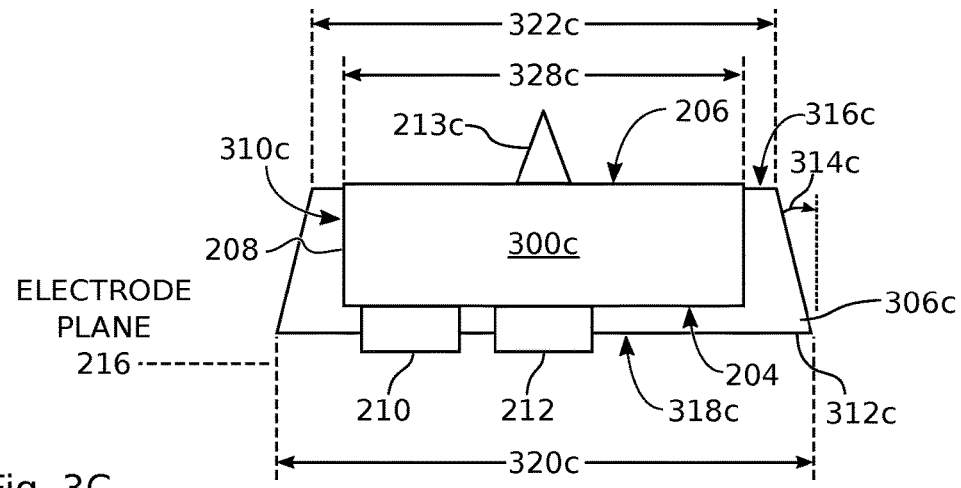
Figure 3D:
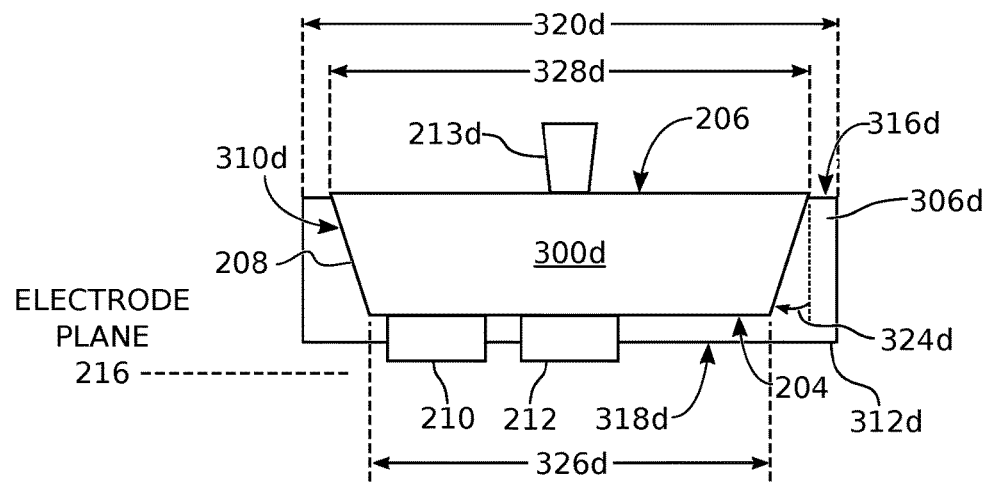

FIGS. 2A and 2B are partial cross-sectional views of encapsulated emissive elements and FIGS. 2C and 2D are plan (top) views of the encapsulated emissive elements. An encapsulated emissive element 200 comprises an emissive element. Emissive elements 202a and 202b are shown. Each emissive element has a profile, a top surface 204, a bottom surface 206, sidewall surfaces 208 between the top and bottom surfaces, and a pair of electrical contacts 210 and 212. In one aspect, as shown in FIG. 2A, the emissive element 202a further comprises a keel or post 213 extending from the emissive element bottom surface 206. Alternatively but not shown, the emissive element may comprise a plurality keels. Further, although the keel is depicted as a cylindrically shaped structure, other shapes are also useful, as depicted in FIGS. 3B, 3C, and 3D. Note: the emissive element top surface is defined as the surface formed adjacent the growth substrate during fabrication, as described in detail below.

One example of an emissive element is a light emitting diode (LED). Although not explicitly shown here (see FIG. 6A), an inorganic LED typically comprises a first semiconductor layer, with either an n-dopant or a p-dopant, a second semiconductor layer with the dopant type not used in the first semiconductor layer, and a multiple quantum well (MQW) layer interposed between the first semiconductor layer and the second semiconductor layer. The MQW layer may include a series of quantum well layers comprising indium gallium nitride (InGaN) and gallium nitride (GaN)) not shown. There may also be an aluminum gallium nitride (AlGaN) electron blocking layer between MQW layers and the p-doped semiconductor layer. The outer semiconductor layer may be p-doped GaN (Mg doping) to form a blue LED, or a green LED if a higher indium content is used in the MQW. The most practical first and second semiconductor layer materials are either gallium nitride, capable of emitting a blue or green light, and aluminum gallium indium phosphide (AlGaInP), capable of emitting red light.

A fluidic assembly key at least partially encapsulates the emissive element to form a profile, different than the emissive element profile. Fluidic assembly keys 214a and 214b are shown respectively partially encapsulating emissive elements 202a and 202b. FIGS. 2A and 2C depict a surface mount or flip-chip emissive element 202a, where first electric contact 210 and second electrical contact 212 extend from the top surface 204, while FIGS. 2B and 2D depict a vertical emissive element 202b, where the first electrical contact 210 extends from the top surface and the second electrical contact 212 extends from the bottom surface 206. Typically, the electrical contacts are formed exclusively on the top or bottom surfaces without extending over the emissive element sidewalls. The electrical contacts may be a metal, doped semiconductor, or transparent conductive oxide (TCO) such as indium tin oxide (ITO). Although not explicitly shown as a distinct layer, the electrical contacts 210 and 212 may be solder or solder-coated (e.g., a eutectic solder) for subsequent connection to electrodes on a display substrate.

The fluidic assembly key is made from a material that may be photoresist, a polymer, light reflective, magnetic, or light absorbing. In the case of surface mount emissive element 202a, the fluidic assembly key 214a may be an electrical insulator isolating the first electrical contact 210 from the second electrical contact 212.

In one aspect, the emissive element top surfaces 204 are substantially planar in a horizontal orientation, parallel to electrode plane 216 shown in FIG. 2A. "Substantially planar" is defined herein as at least 50% of the top surface being aligned in a common plane that is parallel to an electrode plane 216, which is aligned with the interface surface of first electrical contact 210 in the case of a vertical emissive element. In the case of a surface mount emissive element, the electrode plane 216 is aligned with the interface surfaces of both the first electrical contact 210 and the second electrical contact 212. An electrical contact interface surface is the surface making contact to an electrical interface on a display substrate, as can be seen in FIG. 4A. As can be seen, the electrode plane is parallel with the substrate top surface 404. The depicted emissive elements 202a and 202b have respective horizontal profiles 218a and 218b, and the fluidic assembly keys 214a and 214b have a differing horizontal respective profiles 220a and 220b, as defined from a vantage orthogonal to the emissive element top surface 204. In FIG. 2C the emissive element horizontal profile 218a is square and the fluidic assembly key horizontal profile 220a is circular. In FIG. 2D the emissive element horizontal profile 218b is circular and the fluidic assembly key horizontal profile 220b is triangular.

In one aspect, the emissive element (e.g., 202a) is capable of emitting light having a first wavelength, where the first wavelength is associated with a first fluidic assembly key horizontal profile 220a. Further, the fluidic assembly key horizontal profiles 220a and 220b may be one of a plurality of different horizontally oriented shapes, with each horizontally oriented shape associated with a different wavelength of emissive element light emission. In this example, the circular fluidic assembly key horizontal profile 214a may be associated with the emission color blue and the triangular fluidic assembly key horizontal profile 214b associated with the emission color red. Likewise, the emissive element horizontal profiles 218a and 218b may be of differing horizontally oriented shapes, with each emissive element shape associated with a different wavelength of emissive element light emission. Using the above example, the square emissive element horizontal profile 218a may be associated with the blue emission color and the circular emissive element horizontal profile 218b associated with the red emission color.

FIGS. 3A through 3D are partial cross-sectional views of encapsulated emissive element vertical profiles. In one aspect, the emissive elements have vertical profiles with vertically oriented shapes as defined by a thickness between the emissive element top 204 and bottom 206 surfaces, where each emissive element vertical shape is associated with a different wavelength of emissive element light emission. Although only surface mount emissive elements are depicted, vertical emissive elements, with an electrical contact on each of the top and bottom surfaces (see FIG. 2B), can also be formed with different vertical profile shapes, as shown in other examples below.

More explicitly, a first emissive element 300a has first thickness 302 between its top 204 and bottom 206 surfaces and is associated with a first wavelength of emissive element light emission. A second emissive element 300b has second thickness 304 between its top 204 and bottom 206 surfaces, less than the first thickness 302, and is associated with a second wavelength of emissive element light emission. A first fluidic assembly key 306a encapsulates, at least partially, the first emissive element top and bottom surfaces 204/206 to form an overall encapsulated emissive element third thickness 308. A second fluidic assembly key 306b encapsulates, at least partially, the second emissive element top and bottom surfaces 204/206 to form the overall encapsulated emissive element third thickness 308. As described in more detail below, the use of uniformly thick encapsulated emissive elements simplifies fluidic assembly deposition processes by permitting the use of uniformly deep display substrate trap sites.

In another aspect, emissive elements 300c and 300d have respective vertical profiles 310c and 310d, and the corresponding fluidic assembly keys 306c and 306d have a differing vertical profiles 312c and 312d, where a vertical profile is defined from a vantage orthogonal to the emissive element sidewalls 208. For example, as shown in FIG. 3C, fluidic assembly key 306c has a vertical profile slope 314c formed between a fluidic assembly key bottom surface 316c, aligned with the emissive element bottom surface 206, and a fluidic assembly key top surface 318c, aligned with the emissive element top surface 204. The fluidic assembly key top surface width 320c is greater than the fluidic assembly key bottom surface width 322c. In FIG. 3D, fluidic assembly key 306d has a vertical profile slope formed between a fluidic assembly key bottom surface 316d, aligned with the emissive element bottom surface 206, and a fluidic assembly key top surface 318d aligned with the emissive element top surface 204. The fluidic assembly key top surface and bottom surface widths 320d are equal in this example.

In one aspect, the emissive element top 204 and bottom 206 surfaces are substantially planar in a horizontal orientation, parallel to horizontal plane 216. The emissive element sidewalls 208 form a vertically oriented slope 324d between an emissive element top surface width 326d less than the emissive element bottom surface width 328d, as shown in FIG. 3D, or a vertically oriented slope (of zero degrees) between an emissive element top surface and bottom surface widths 328c, as shown in FIG. 3C.

In FIG. 3A the keel is depicted as a cylindrically shaped structure, but other shapes are also useful, as depicted in FIGS. 3B, 3C, and 3D. For example, as seen from a top view the keel may have a rectangular, oval, oblong, or multi-faceted polygon shape, or as seen in cross-section, the keel may be tapered. In addition, although the keel 213 is shown located at the center of the emissive element bottom surface in FIG. 3A, in FIG. 3B the keel 213b is not centered. In FIG. 3C keel 213c tapers narrowly to a point as it extends from the bottom surface 206. In contrast, FIG. 3D depicts keel 213d tapering to a minimum width at the intersection with the bottom surface 206. In fluidic deposition the flow velocity decreases to zero at the substrate top surface. So the working principle of the keel is to create a low torque if the keel is up (correctly oriented) with the emissive element top surface against the substrate top surface, or a high torque if the keel is down (against the substrate top surface) because a large area of the emissive element is farther from the substrate top surface in faster moving fluid. Typically, the keel has a shape that creates a point of contact with the substrate top surface that is distant from the emissive element bottom surface, but close to the central axis of the emissive element. Thus, the keel has a small cross section to minimize fluid force when up (the emissive element top surface is adjacent the substrate top surface), but that also tilts the emissive element sufficiently that it flips in the flow when incorrectly oriented (upside down).

FIGS. 4A and 4B are, respectively, partial cross-sectional and plan views of a fluidic assembly emissive display. The display 400 comprises a substrate 402 with a top surface 404 and a plurality of trap sites 406-0 through 406-n, where n is an integer greater than one. Some examples of emissive displays include televisions, computer monitors, handheld device screens, and backlights for LCD displays, as might be used for some of the above-mentioned examples, or as a direct emission display. The n number of trap sites may represent a single pixel with n subpixels (n emission colors). For simplicity, only a single pixel is shown. The trap sites 406-0 through 406-n, which may also be referred to as wells, cavities, apertures, or orifices, are formed in the substrate top surface 404, with each trap site having an opening 408 with respective horizontal shapes 428-0 through 428-n, defined from a vantage orthogonal to the substrate top surface 404. Each trap site 406-0 through 406-n also has a bottom surface 412 with at least a first electrical interface 414 connected to a corresponding intersection with a row or column in an underlying enablement matrix 417. As shown, the bottom surfaces 412 of trap sites 406-0 and 406-1 also include a second electrical interface 416.

The matrix or array can be powered as a passive matrix so each row is turned on in sequence with each sub-pixel in the array powered at a controlled current to produce the required brightness. However, due to sampling and power restraints this simple driving scheme is necessarily limited to a relatively small number of rows. Alternatively, each sub-pixel can be controlled by a thin-film transistor (TFT) driving circuit (not shown), which can control the amount of drive current based on the charge stored in a capacitor (not shown). This active matrix (AM) circuit configuration allows the uLED to be powered nearly 100% of the time so there is no limit on the number of rows in a display, except for the power supplied to each column. Additional details concerning the matrix can be found in U.S. Pat. No. 9,825, 202, which is incorporated herein by reference.

Encapsulated emissive elements 418-0 through 418-n respectively occupy trap sites 406-0 through 406-n. Encapsulated emissive elements 418-0 through 418-n respectively comprise emissive elements 420-0 through 420-n. As shown in FIGS. 2A and 2B, each emissive element has a profile, top surface, a bottom surface, and sidewall surfaces between the top and bottom surfaces. Emissive elements 420-0 and 420-n have first electrical contacts 210 connected to corresponding trap site first electrical interfaces 414. In addition, emissive elements 420-0 and 420-1 have second electrical contacts 212 connected to corresponding trap site second electrical interfaces 416. In this example, emissive elements 420-0 through 420-n also comprise a keel 213. Fluidic assembly keys 422-0 through 422-n respectively, at least partially, encapsulate the emissive element to form a profile, different than the emissive element profile.

As described in FIGS. 2A through 2D, each emissive element top surface 206 is substantially planar in a horizontal orientation, parallel to electrode plane 216. As shown in FIG. 4B, emissive elements 420-0 through 420-*n* have respective horizontal profiles 424-0 through 424-*n* and the fluidic assembly keys 422-0 through 422-*n* have differing horizontal profiles 426-0 through 426-*n*, as defined from a vantage orthogonal to the emissive element top surface 204. The display substrate top surface 404 is substantially planar in the horizontal orientation, parallel to electrode plane 216, and trap site opening shapes 428-0 through 428-*n* respectively match the horizontal profile of its occupying encapsulated emissive element fluidic assembly key.

As mentioned above, the wavelength of light emitted by a particular emissive element may be associated with a corresponding fluidic assembly key horizontal profile. More explicitly, assuming that n=2, the display may comprise a first horizontally oriented shape 428-0, matching fluidic assembly key profile 426-0, a second horizontally oriented shape 428-1, differing from the first horizontally oriented shape but matching profile 426-1, and a third horizontally oriented shape 428-*n*, differing from the first and second horizontally oriented shapes, but matching profile 426-*n*. In this context, "matching" means being able to accept one particular type of profile while rejecting other types of profiles. Each horizontally oriented shape 428-0 through 428-*n* may then be associated with a different wavelength of emissive element light emission. Likewise, as described in more detail in the explanation of FIGS. 2A through 2D, differing horizontal or vertical shapes (as defined by thickness or sidewall slope) may also be associated with a different wavelength of emissive element light emission.

In one aspect, emissive element 420-0 has a first thickness between its top and bottom surfaces and is associated with a first wavelength of emissive element light emission, while emissive element 420-1 has a second thickness between its top and bottom surfaces, less than the first thickness, and is associated with a second wavelength of emissive element light emission. Fluidic assembly key 422-0 encapsulates the emissive element 420-0 top and bottom surfaces to form an overall encapsulated emissive element third thickness, and fluidic assembly key 422-1 encapsulates the emissive element 420-1 top and bottom surfaces to form the overall encapsulated emissive element third thickness. In the interest of simplifying FIG. 4A, details of the particular surfaces and thicknesses are presented in the description of the encapsulated emissive elements of FIGS. 3A and 3B. Since the thicknesses of the encapsulated emissive elements 418-0 and 418-1 are the same, trap sites 406-0 and 406-1 can be made to the same depth to simplify substrate fabrication.

As noted in the explanation of FIGS. 3C and 3D, emissive elements and their corresponding fluidic assembly keys may have differing vertical profiles, where a vertical profile is defined from a vantage orthogonal to the emissive element sidewalls. In FIG. 4A, the fluidic assembly keys 422-0 and 422-1 have a vertical profile slope formed between a fluidic assembly key bottom surface, aligned with the emissive element bottom surface, and a fluidic assembly key top surface aligned with the emissive element top surface. The fluidic assembly key top surface width is greater than the fluidic assembly key bottom surface width. Details of a fluidic assembly key having a greater top surface width can be found in the description of FIG. 3D above. Alternatively, fluidic assembly key 422-*n* has equal top and bottom widths, as shown in greater detail in FIG. 3C.

As shown in FIG. 4A, substrate trap sites 406-0 through 406-11 comprise sidewalls with a vertical profile slope formed between the trap site opening 408 and the trap site bottom surface 412. For trap sites 406-0 and 406-1, the width 430 of the substrate trap site bottom surface 412 is less than the width 432 of the trap site opening 408. Alternatively, as shown in trap site 406-*n*, the width of the substrate trap site bottom surface 412 is equal to the width of the trap site opening 408.

Typically, the emissive element top and bottom surfaces are substantially planar in a horizontal orientation and the emissive element sidewalls form a vertically oriented slope between an emissive element top surface width less than the emissive element bottom surface width (see FIG. 3D), or equal to an emissive element bottom surface width (see FIG. 3C).

The fluidic assembly composite microcomponents may be either vertical or flip-chip configuration micro-LED devices that are at least partially enclosed, for example, in a polymeric matrix that is not contiguous with other micro-LEDs. In other words, individual micro-LEDs are processed to make this protective polymer structure prior to harvest into suspension. The harvest into suspension is a critical step because high-speed, low-cost assembly is necessarily massively parallel. The fluidic assembly of micro-LED suspensions is the most developed parallel approach in high-speed micro-LED assembly, but the stochastic nature of the process exposes the micro-LEDs to collisions, shear, and general stresses that are less well controlled than deterministic assembly approaches such as pick-and-place. Here, the mechanical stresses experienced by micro-LEDs during harvest from the growth or handling substrates, and agitation of the assembly suspension, occurs between devices that are protected by the polymer structure.

Efficient assembly is sensitive to the shape and size of both the component and trap site on the substrate—forming the component in such a way that the assembly characteristics are dominated by the shape and characteristics of the polymer allows optimization of the assembly characteristics independent of the height, shape, angle, edge, and size tolerance limitations of micro-LED processing. Gallium nitride (GaN) is a difficult material to pattern so the dry etching process using high energy chlorine radicals tends to produce a tapered sidewall as the masking material is eroded. The masking material may be a photoresist or a hard mask such as silicon dioxide ($SiO_2$), chromium, or nickel. The resulting micro-LED may have a sidewall with an inward taper that can be from 60 to 80 degrees, where 90 degrees is vertical. It is very difficult to produce a sidewall slope greater than about 75 degrees. Because of the nature of the GaN patterning process it is prohibitive to produce a reentrant sidewall shape (greater than 90 degrees) on the micro-LED device itself. In the case of fluidic assembly a reentrant sidewall shape is formed as a result of the LED top surface width being greater than the bottom surface width. Fortunately, a negative acting photopolymer can be patterned to produce a reentrant sidewall profile by control of the exposure dose and development time of the photolithography process.

Figure 5A:
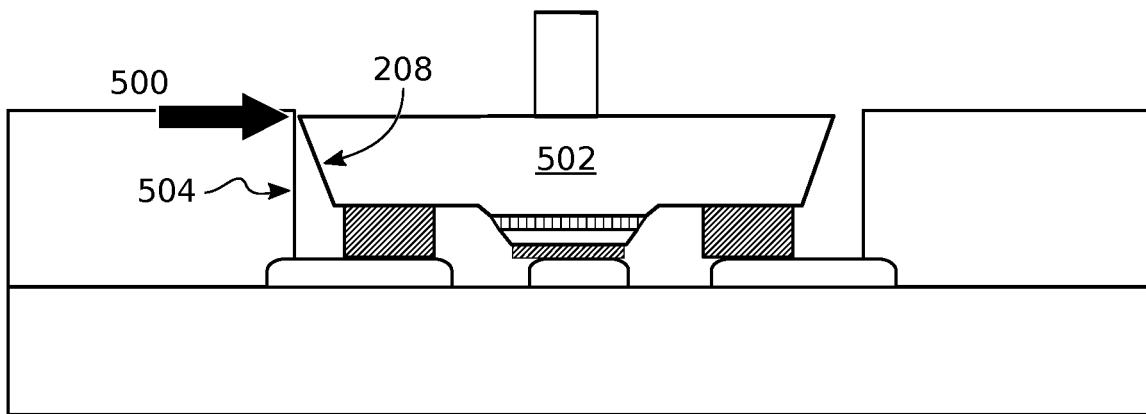
FIGS. 5A through 5C are partial cross-sectional views depicting exemplary emissive element and fluidic assembly key sidewall profiles contrasting the component shape to the trap site shape.
Figure 5B:
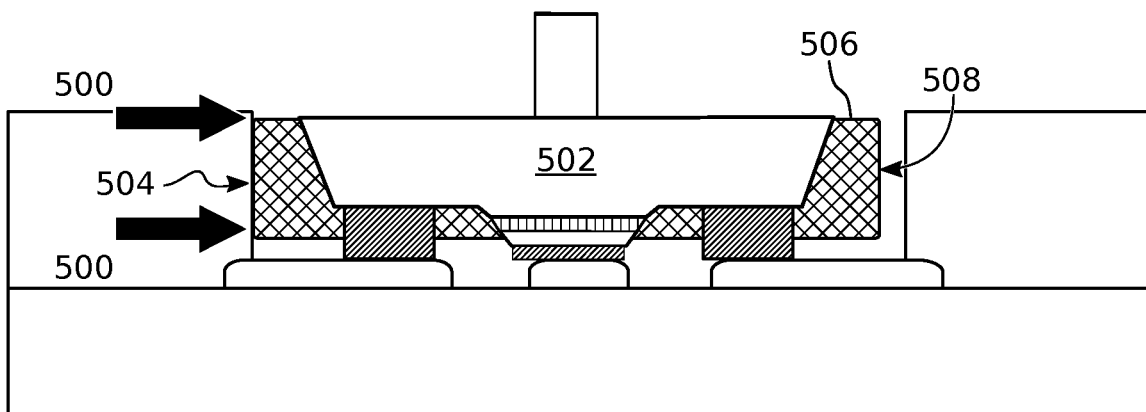
Figure 5C:
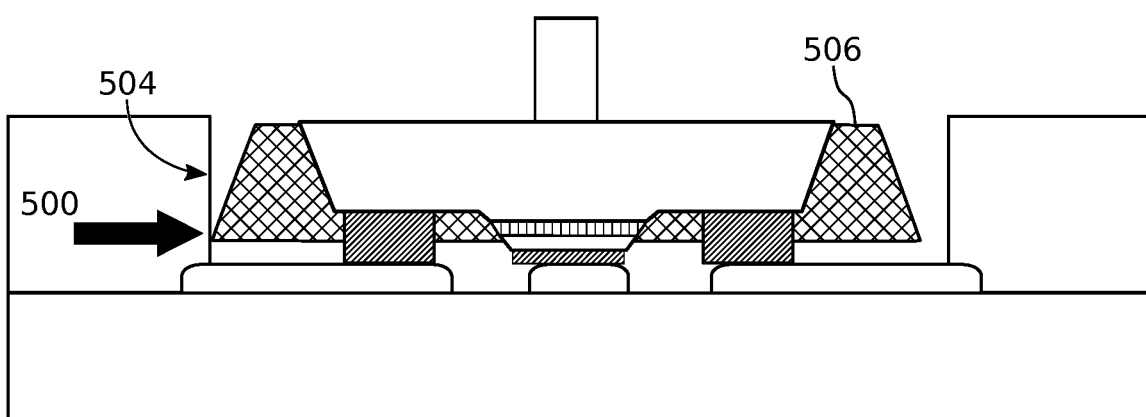

FIGS. 5A through 5C are partial cross-sectional views depicting exemplary emissive element and fluidic assembly key sidewall profiles contrasting the component shape to the trap site shape. FIG. 5A shows a typical micro-LED shape with a sidewall 208 which is tapered inward due to the low selectivity of the GaN isolation etch. It can be seen that the shape of the micro-LED sidewall dictates that the contact point 500 between the micro-LED 502 and the trap site sidewall 504 is near the top of the trap site. In contrast, the polymer encapsulant 506 with a vertical sidewall 508 can contact 500 a vertical trap site sidewall 504 over most of the trap site height as shown in FIG. 5B. In FIG. 5C, the encapsulant 506 with an outward taper can contact 500 the trap site sidewall 504 near the bottom. The position of the contact point 500 between trap site and micro-LED determines the rotational moment induced by fluid flow, which in turn determines the detrapping probability for a captured micro-LED.

Additionally, outward-tapering encapsulant sidewalls provide a surface where purely lateral forces can result in detrap of captured micro-LEDs. It is also important to note that the most advantageous component and trap site shapes for high-speed fluidic assembly are generally not exactly complementary. The dynamics of trapping and detrapping are asymmetric and the encapsulant described herein provides a structure that can be readily optimized for assembly efficiency and display quality.

Lastly, the large-scale and stochastic nature of fluidic assembly must account for uncertainty in trap site shapes, micro-LED shapes, and how the micro-LED is disposed in the trap site. Micro-LEDs may often tilt and move in trap sites during assembly and the encapsulant shapes described herein enable tuning the forces of those interactions in an enhanced manner.

Figure 6A:
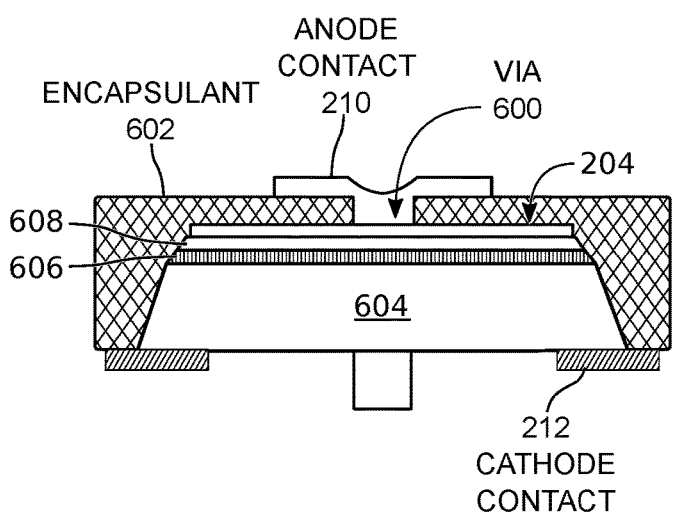
FIGS. 6A and 6B are, respectively, partial cross-sectional and plan (top down) views of a micro-LED with contacts in the vertical chip configuration.
Figure 6B:
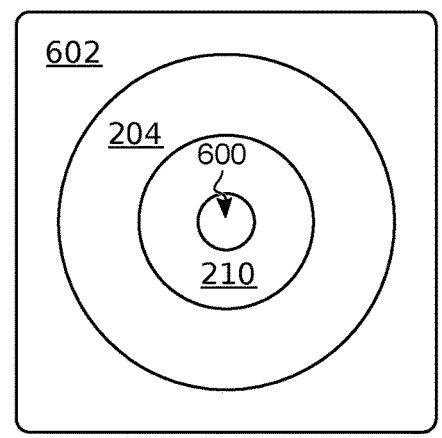

FIGS. 6A and 6B are, respectively, partial cross-sectional and plan (top down) views of a micro-LED with contacts in the vertical chip configuration. Also shown are a first semiconductor layer 604, MQW layer 606, and second semiconductor layer 608. The first and second conductor layers may be either n or p doped, but they are of opposite polarity. For simplicity, the figures and descriptions are of a micro-LED with the first semiconductor layer 604 being n doped. A via 600 in the encapsulant 602 allows an electrical contact (anode) 210 to the micro-LED top surface 204, while the cathode contact 212 is made to a region unpassivated by the encapsulant. As can be seen, the encapsulant size and shape are independent of the micro-LED size and shape, and the polymer encapsulant 602 also leaves at least one plane or surface of the micro-LED uncovered. As the encapsulant 602 may be opaque or reflective to prevent light transmission, this opening may be utilized for light extraction from the micro-LED as well as for the cathode contact 212 shown. The anode contact 210, while shown with a smaller diameter than the micro-LED, could extend to a larger diameter than the micro-LED width, particularly, in the case where light is intended to be directed through the bottom surface of the device.

Figure 7A:
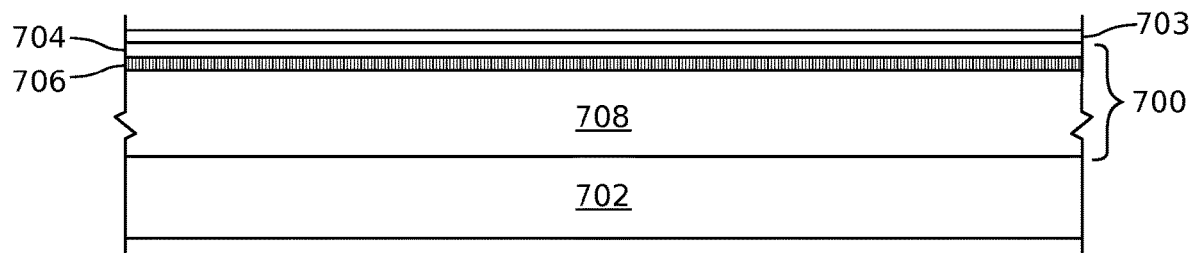
FIGS. 7A through 7I are partial cross-sectional views depicting a sample process flow that enables the partial encapsulation of a vertical configuration micro-LED in a patterned polymer matrix.
Figure 7B:
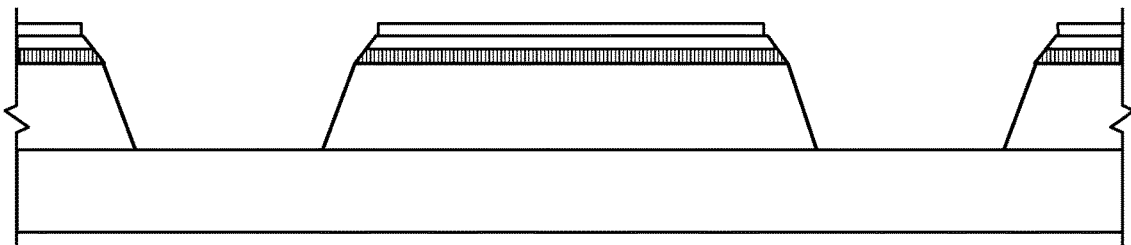
Figure 7C:
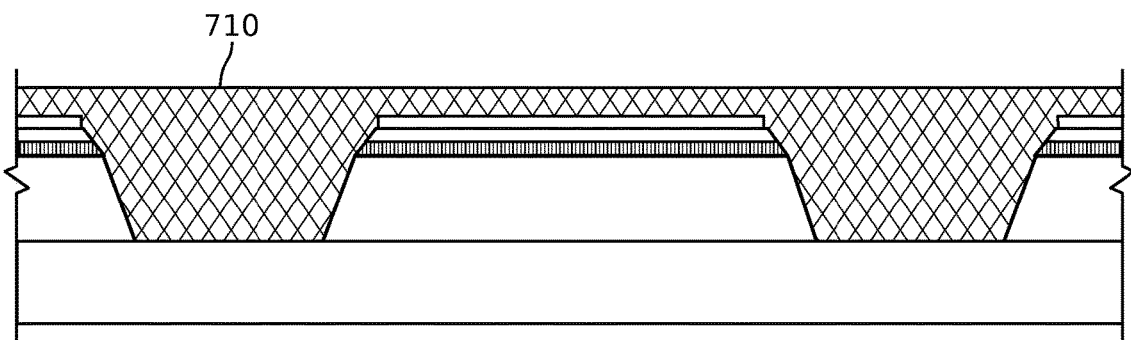
Figure 7D:
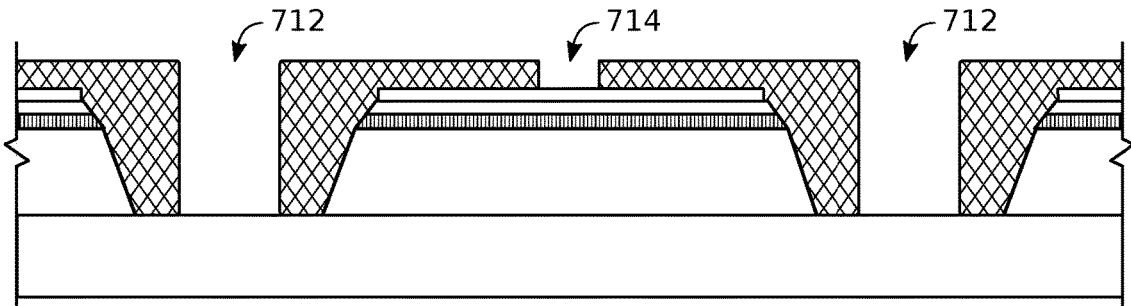
Figure 7E:
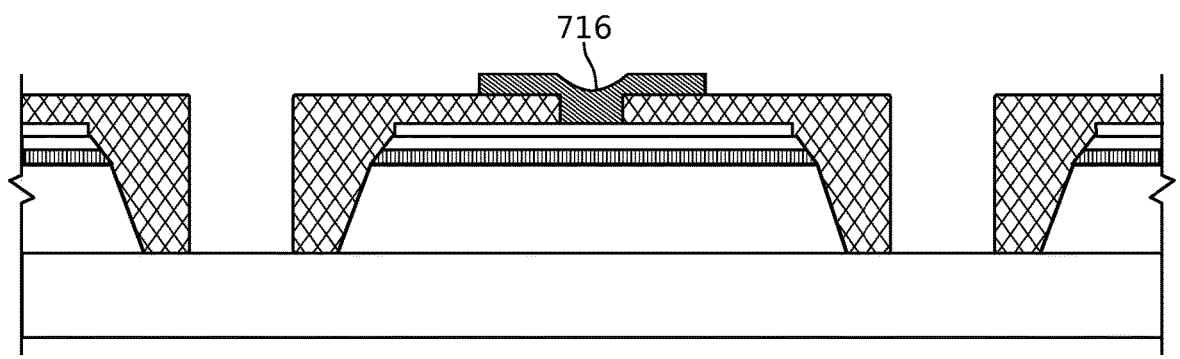
Figure 7F:
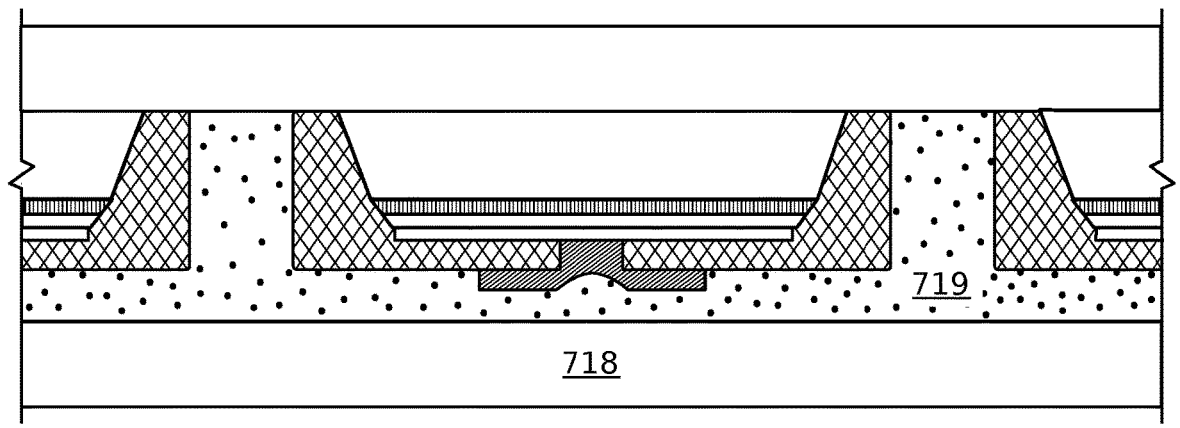
Figure 7G:
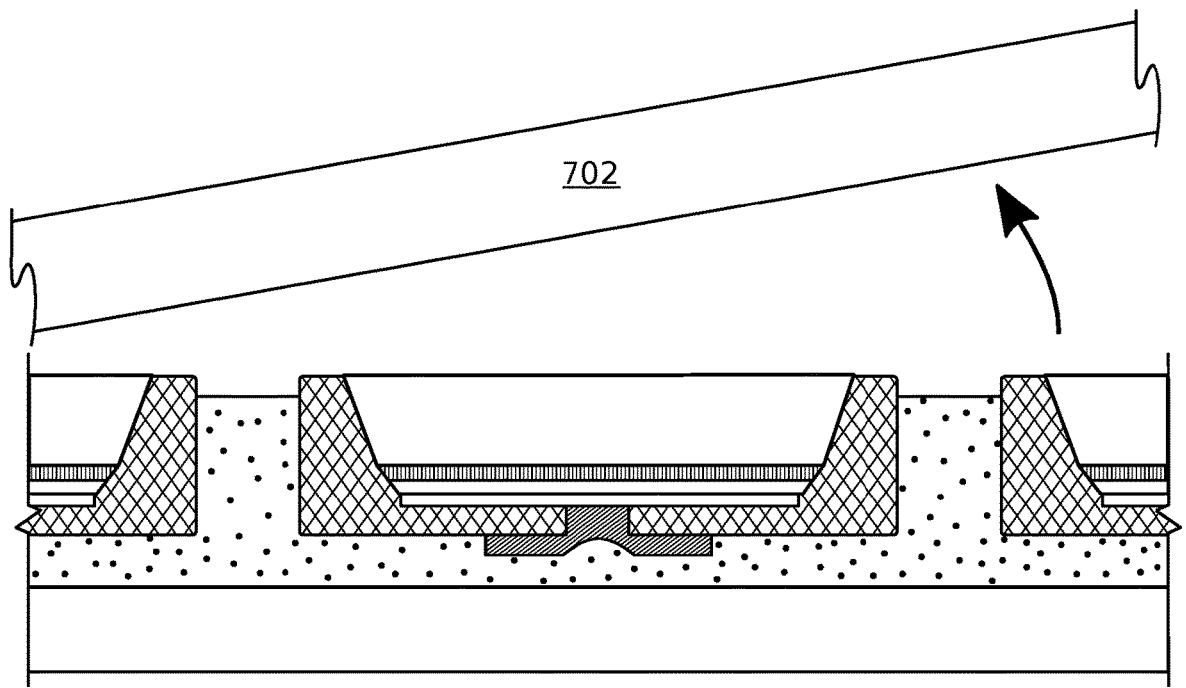
Figure 7H:
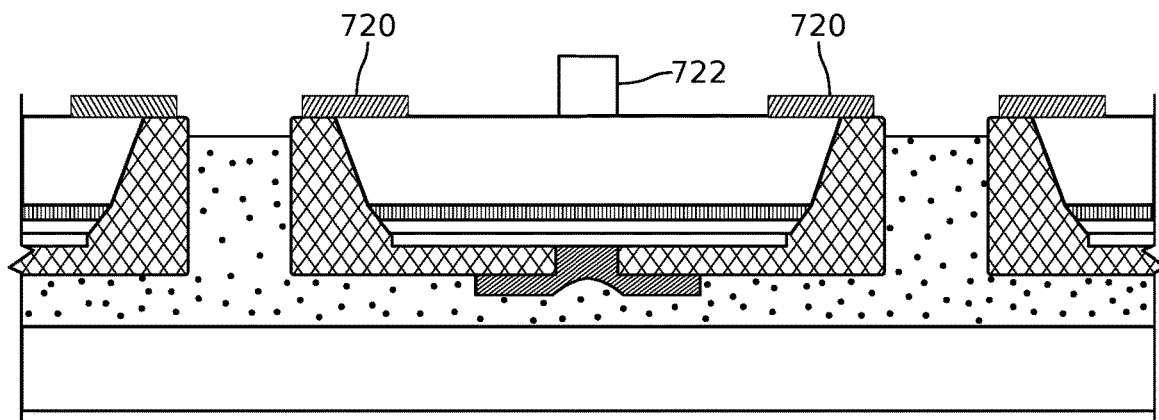
Figure 7I:
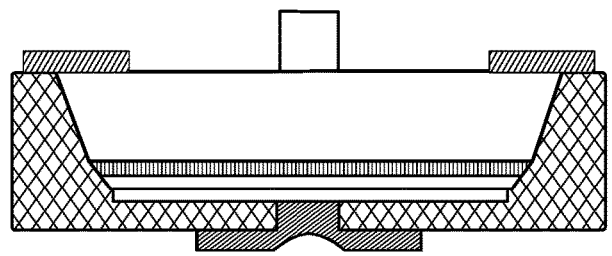

FIGS. 7A through 7I are partial cross-sectional views depicting a sample process flow that enables the partial encapsulation of a vertical configuration micro-LED in a patterned polymer matrix. In FIG. 7A the micro-LED heterostructure 700, such as variably doped gallium nitride, is epitaxially grown on a sapphire substrate 702 and covered with a metal stack and/or transparent conductor like indium tin oxide (ITO) 703 for electrical contact to the device anode. For example, the heterostructure 700 may comprise a p-GaN layer 704, and MQW layer 706, and n-GaN layer 708. In FIG. 7B the micro-LEDs are etched to form individual emitters. In FIG. 7C the isolated micro-LEDs are then coated with the patternable polymer matrix 710. One useful material is SU8 which is spun on and photopatterned, but other material choices include alternate photoresists or non-photopatternable polymers, which are etched in FIG. 7D to form patterns after deposition and curing. The pattern for a partially encapsulated vertical configuration micro-LED is the isolation trench 712 around the micro-LED with the desired size, shape, sidewall profile, etc. and a via opening 714 through to the micro-LED's top surface. In FIG. 7E the via is metallized to form an electrical contact 716 to the top surface of the micro-LED. This metallization may be done via plating, patterned metal deposition, or clip-coating, which may be planarized after deposition. In FIG. 7F the isolated devices are bonded to a temporary handling matrix (handling substrate) 718. Typically, an adhesive or wax 719 is used to attach the handle substrate to the isolated devices. In the interest of brevity the adhesive/wax layer is shown in the FIGS. 8, 10, and 11 series of drawings, but not labeled with a reference designator. In FIG. 7G the microcomponents are then released from the growth substrate 702 with an appropriate process, such as laser lift-off for GaN devices or an appropriate wet etch for gallium arsenide (GaAs) based devices such as red LEDs fabricated from aluminum gallium indium phosphide (AlGaInP). After laser lift-off the growth substrate is removed leaving the LEDs positioned on the carrier (handling) substrate with the bottom surfaces exposed. A metal electrode 720 suitable for electrical contact to the device cathode is deposited and patterned. After the electrode is completed, an optional keel structure 722 may be formed in FIG. 7H that is useful to provide orientation control in fluidic assembly. In FIG. 7I the temporary handling matrix has been dissolved.

Figure 8A:
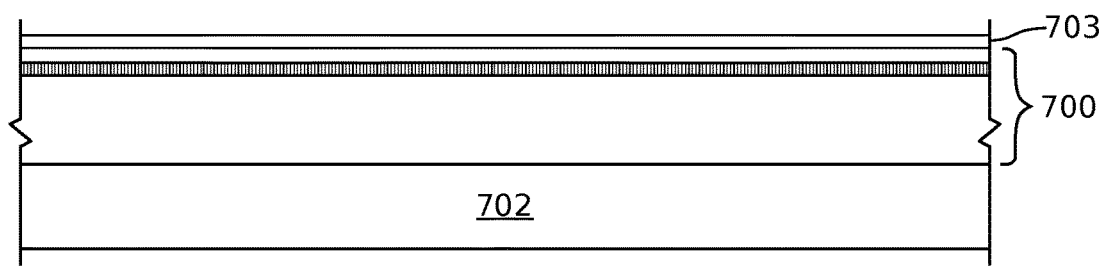
FIGS. 8A through 8J are partial cross-sectional views depicting an alternative sample process flow that enables the partial encapsulation of a vertical configuration micro-LED in a patterned polymer matrix using a thin buffer layer between encapsulant and growth substrate.
Figure 8B:
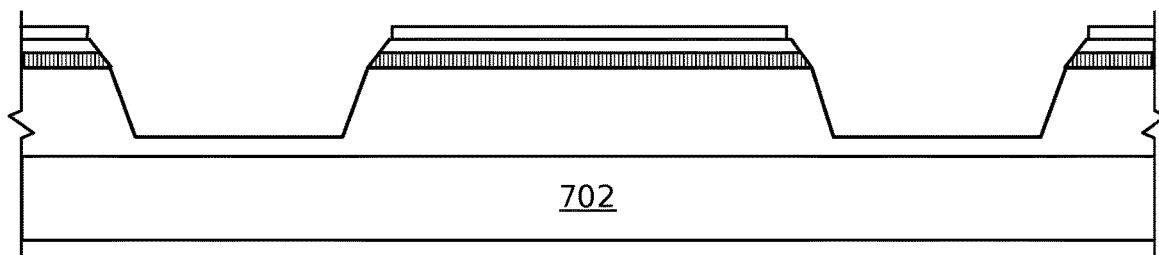
Figure 8C:
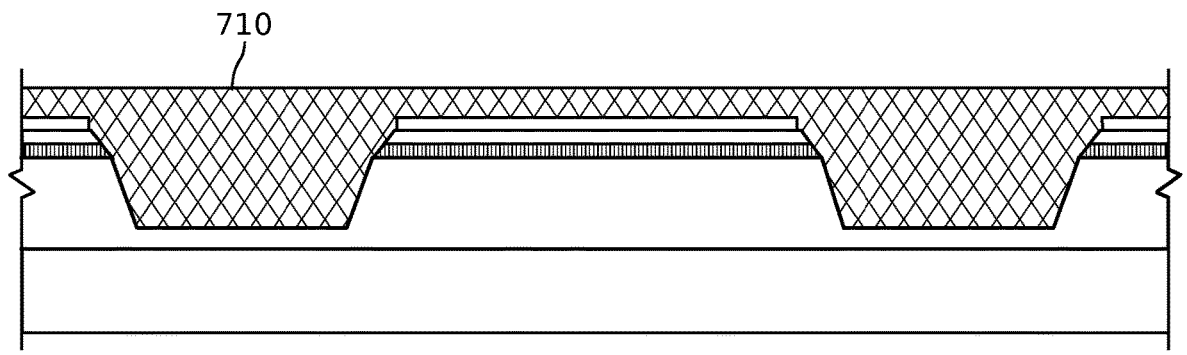
Figure 8D:
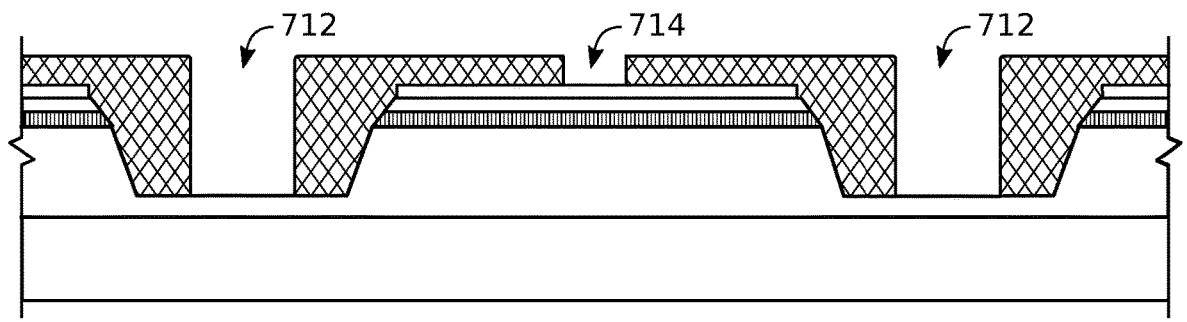
Figure 8E:
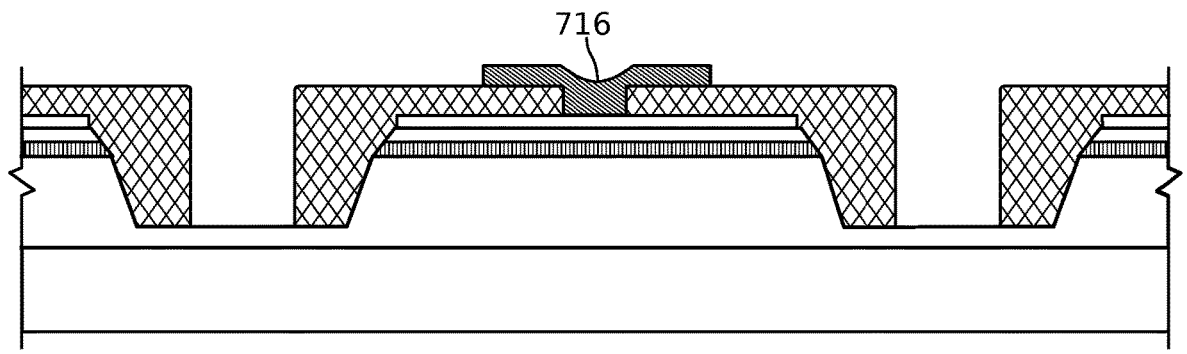
Figure 8F:
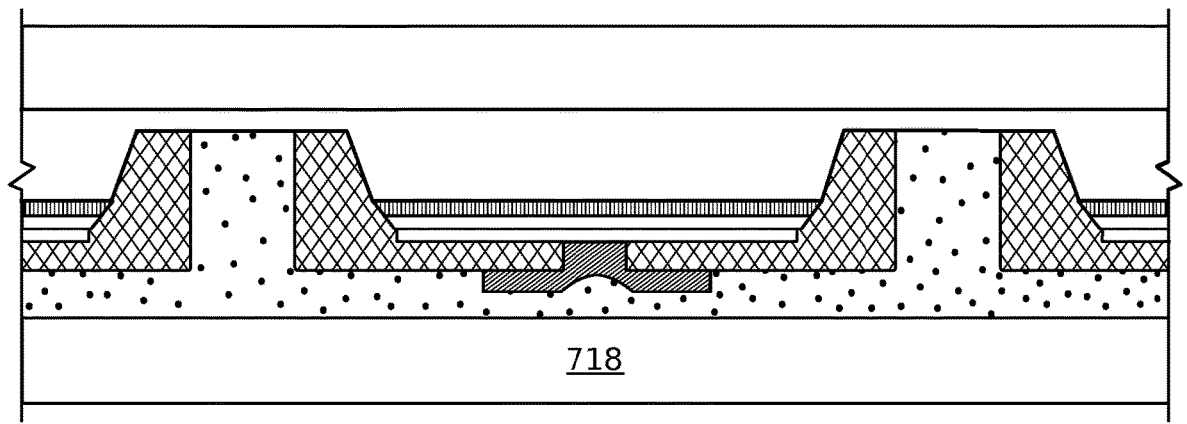
Figure 8G:
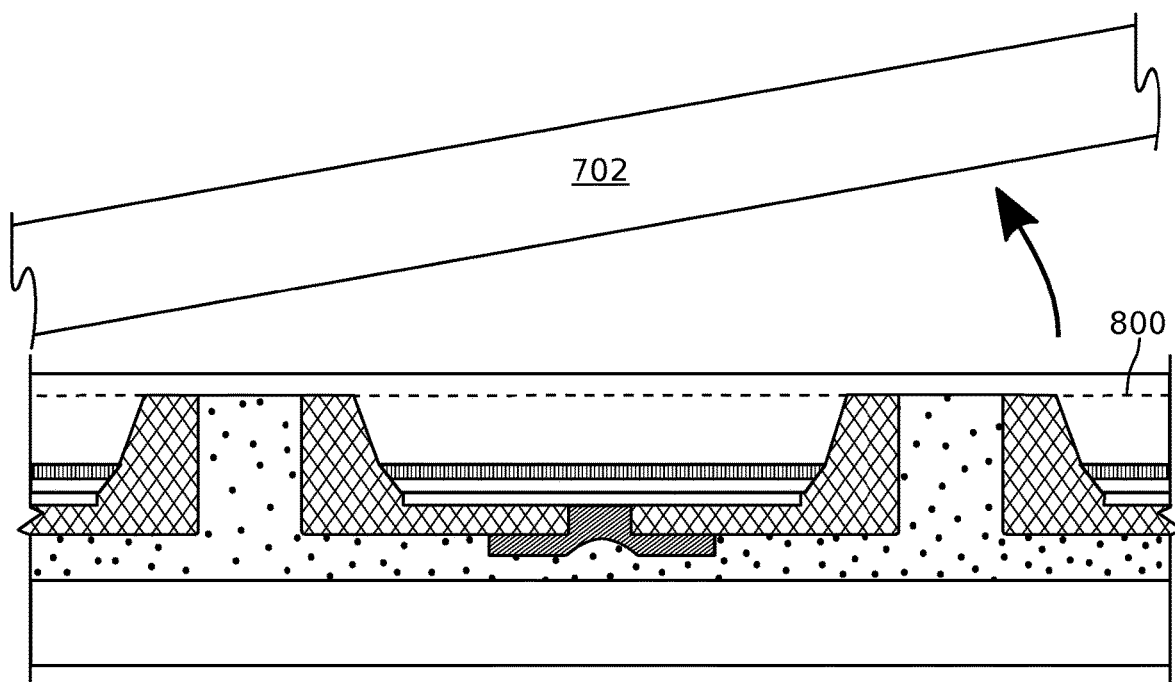
Figure 8H:
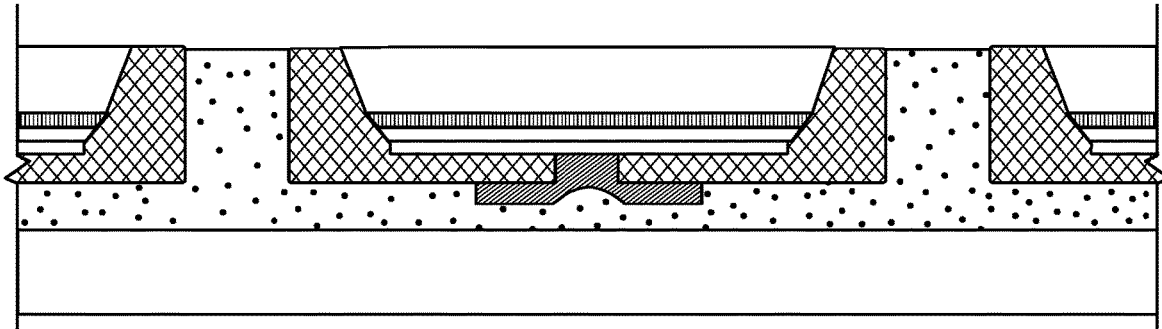
Figure 8I:
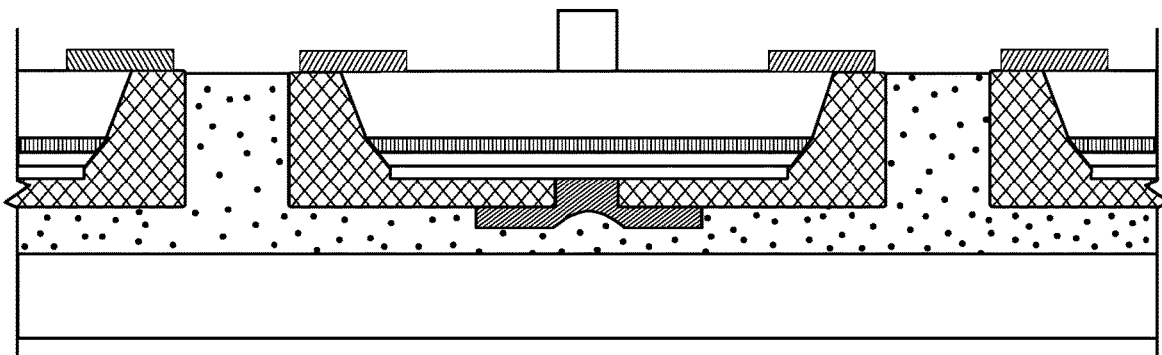
Figure 8J:
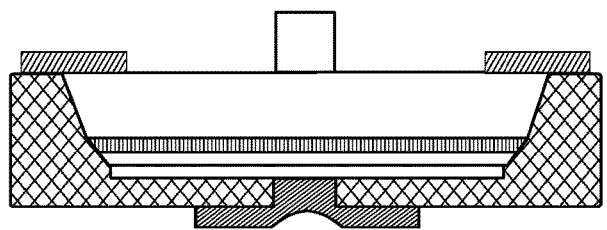

FIGS. 8A through 8J are partial cross-sectional views depicting an alternative sample process flow that enables the partial encapsulation of a vertical configuration micro-LED in a patterned polymer matrix using a thin buffer layer between encapsulant and growth substrate. A potential issue with the process flow of FIGS. 7A through 7I is that the encapsulant polymer is in direct contact with the growth substrate. For release of the component using, for example, laser lift-off, it may be desirable to leave a continuous interface between the epitaxial layer and the growth substrate. The steps associated with FIGS. 8A through 8G, 8I, and 8J are essentially identical to the steps associated with FIGS. 7A through 7I, except the etch of the micro-LED heterostructure 700 in FIG. 8B is stopped before reaching the growth substrate 702 and the process continues as shown. FIG. 8H depicts the results of etching of the remaining thin GaN 800 (see FIG. 8G), left after the etching performed in FIG. 8B.

Figure 9A:
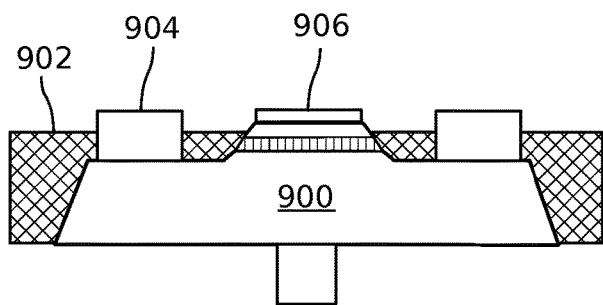
FIGS. 9A and 9B are, respectively, partial cross-sectional and plan views showing encapsulation prior to release from a growth substrate.
Figure 9B:
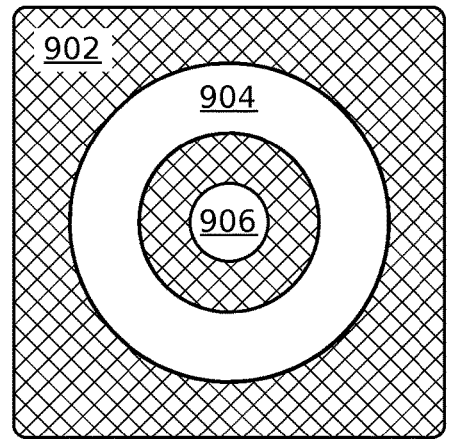
Figure 9C:
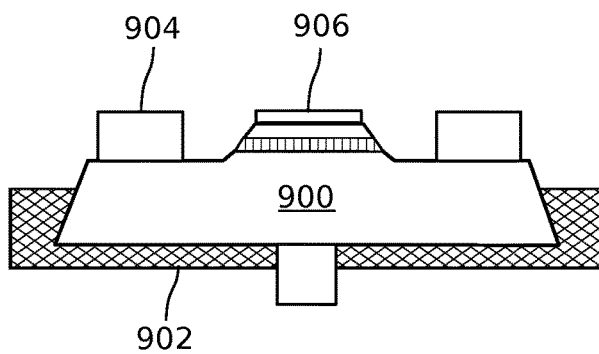
FIGS. 9C and 9D are, respectively, partial cross-sectional and plan views showing encapsulation after release from a growth substrate.
Figure 9D:
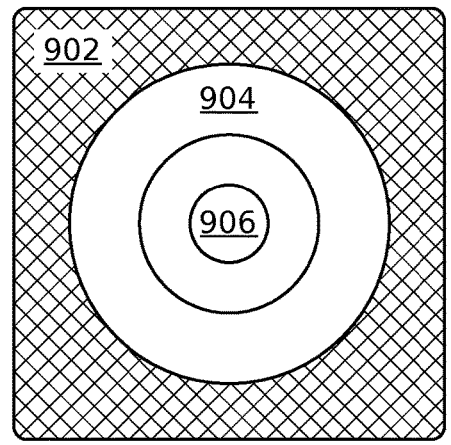
Figure 9E:
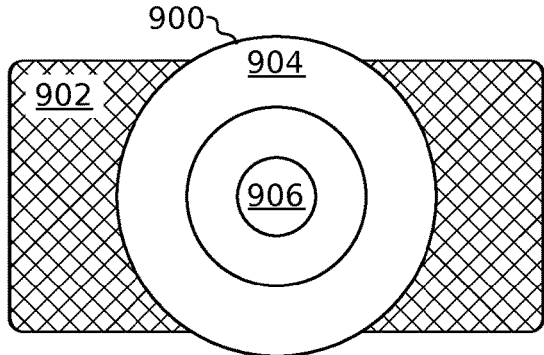
FIG. 9E is a plan view showing partial encapsulation of the emissive element.

FIGS. 9A and 9B are, respectively, partial cross-sectional and plan views showing encapsulation prior to release from a growth substrate. FIGS. 9C and 9D are, respectively, partial cross-sectional and plan views showing encapsulation after release from a growth substrate. FIG. 9E is a plan view showing partial encapsulation of the emissive element. While vertical LEDs have several significant advantages for the fabrication of emissive displays, they do require additional processing after fluidic assembly to make the top electrical interface. To simplify processing after fluidic assembly an emissive display may utilize flip-chip or surface mount configurations where both LED contacts are on the top surface so they can be aligned with electrodes in the substrate and are bonded through a standard method such as solder reflow. In this configuration, cathode 904 and anode 906 electrodes extend from the top surface of the micro-LED 900 as shown in two possible configurations. The difference between the two structures is whether the encapsulant 902 is applied before (see FIGS. 10A through 10I) or after release from the epitaxial growth substrate (see FIGS. 11A through 11I1). In contrast to FIGS. 9B and 9D, which show the horizontal profile of the encapsulant 902 completely extending beyond the horizontal profile of the emissive element 900, in FIG. 9E the encapsulated emissive element has an overall horizontal profile that is partially the result of the emissive element horizontal profile and partially the result of the fluidic assembly key horizontal profile.

Figure 10A:
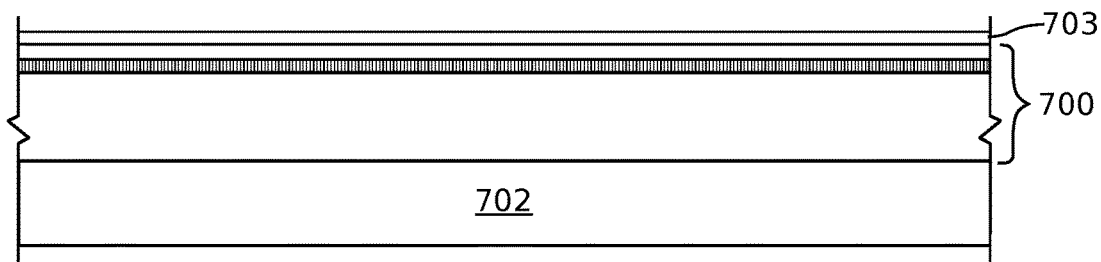
FIGS. 10A through 10I depict an exemplary process flow for the partial encapsulation of surface mount configuration composite microcomponents prior to release from a growth substrate.
Figure 10B:
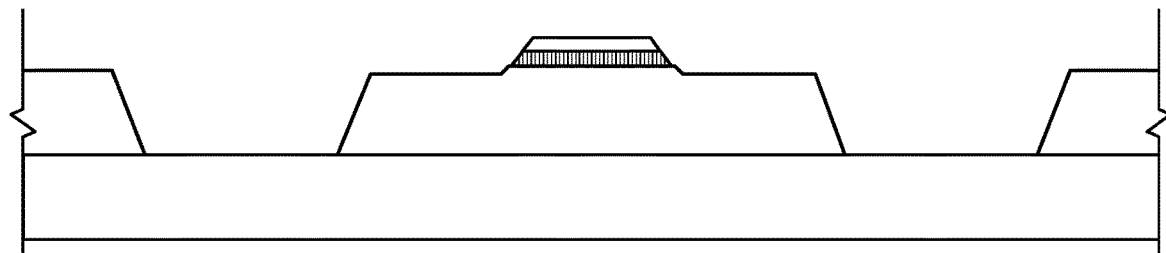
Figure 10C:
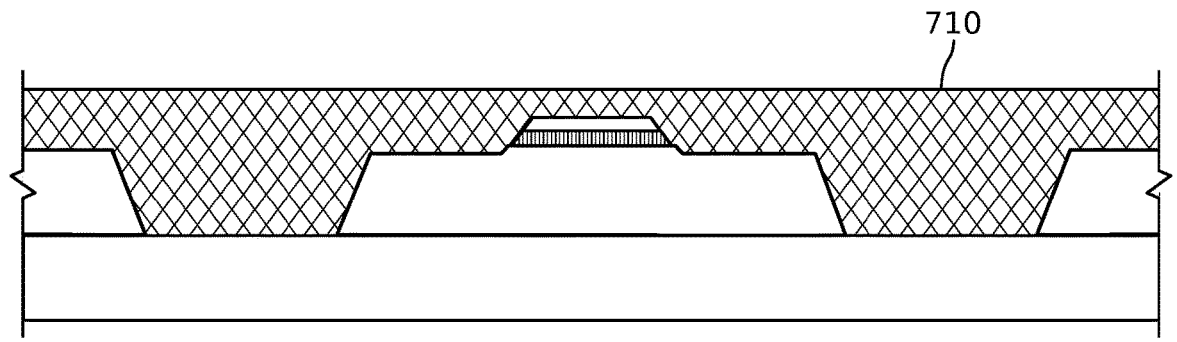
Figure 10D:
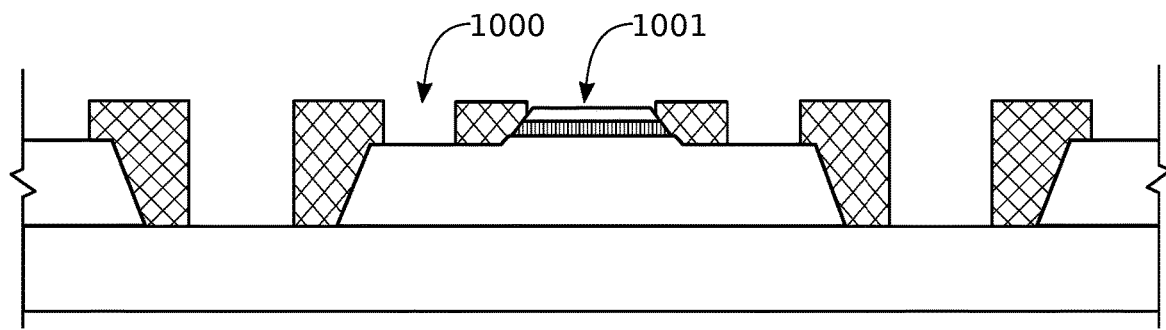
Figure 10E:
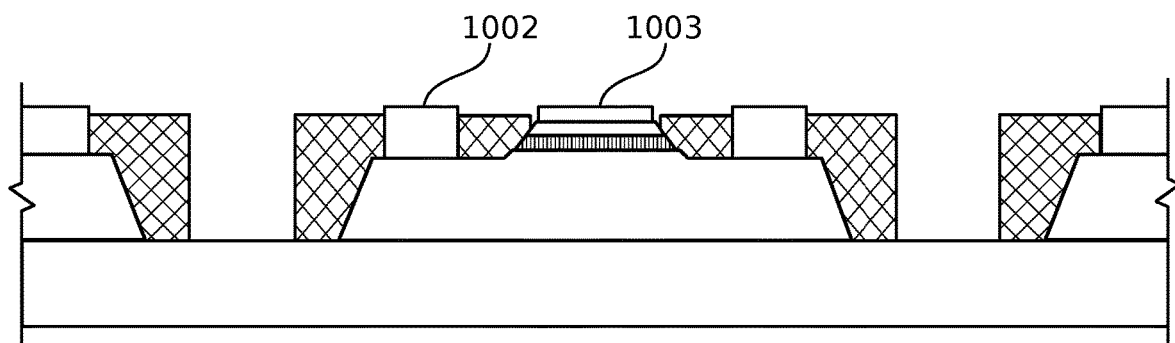
Figure 10F:
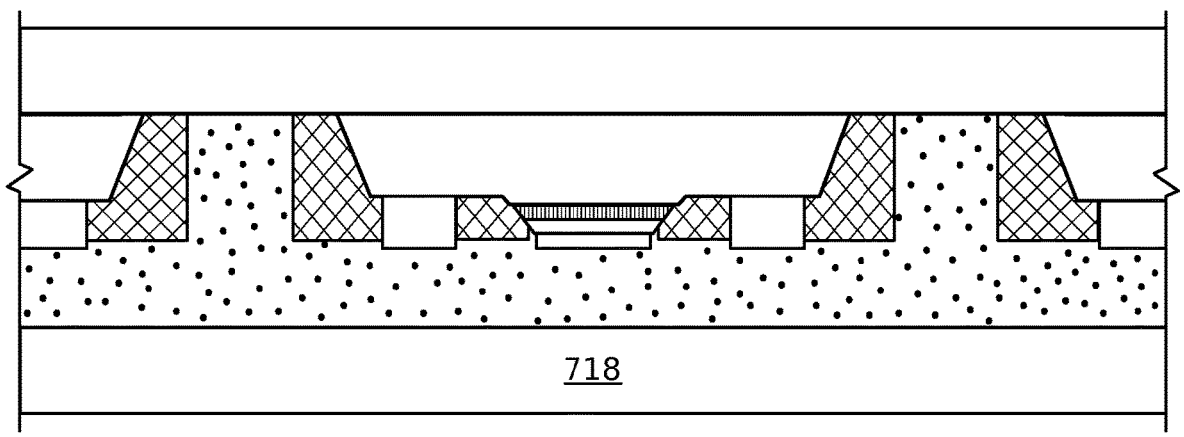
Figure 10G:
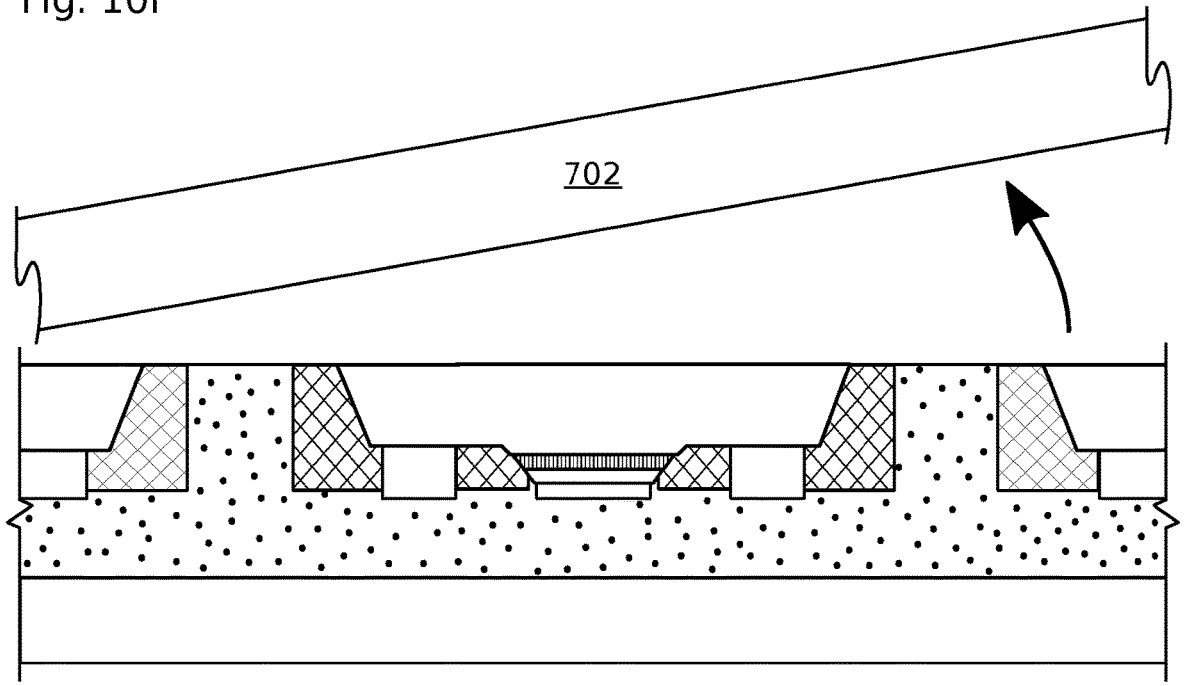
Figure 10H:
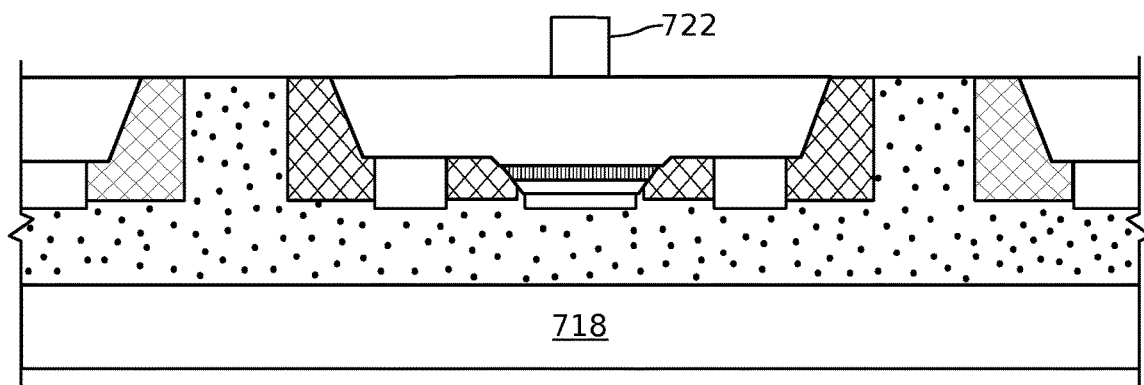
Figure 10I:
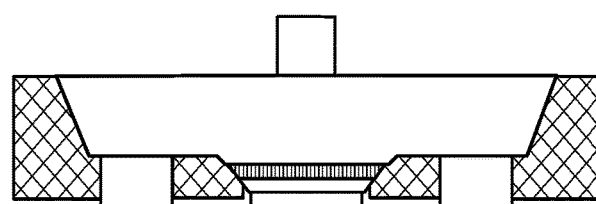

FIGS. 10A through 10I depict an exemplary process flow for the partial encapsulation of surface mount configuration composite microcomponents prior to release from a growth substrate. Although not explicitly shown, the same processing option utilizing thin GaN and described in FIGS. 8B and 8I1 can be used in this process flow. In FIG. 10A the micro-LED heterostructure 700, such as variably doped gallium nitride, is epitaxially grown on a sapphire substrate 702. The top surface may be coated with a metal stack and/or a transparent conductor like ITO 703 for electrical contact to the device anode and cathode. In FIG. 10B the micro-LED heterostructure emitter areas are etched as a mesa, and simultaneously etched to isolate and form individual micro-LEDs. In FIG. 10C the isolated micro-LEDs are then coated with the patternable polymer matrix, which is etched in FIG. 10D to form patterns after deposition and curing. The pattern for a partially encapsulated flip-chip configuration micro-LED includes via openings 1000 and 1001 through to the micro-LED's top surface. In FIG. 10E the vias are metallized to form electrical contacts 1002 and 1003 to the top surface of the micro-LED. In FIG. 10F the isolated devices are bonded to a temporary handling matrix. In FIG. 10G the microcomponents are then released from the growth substrate 702 with an appropriate process, such as laser lift-off for GaN devices or an appropriate wet etch for GaAs based devices. After laser lift-off the growth substrate is removed leaving the LEDs positioned on the handling substrate 718 with the bottom surfaces exposed. An optional keel structure 722 may be formed in FIG. 10I1 that is useful to provide orientation control in fluidic assembly. In FIG. 10I the temporary handling matrix has been dissolved.

Figure 1:
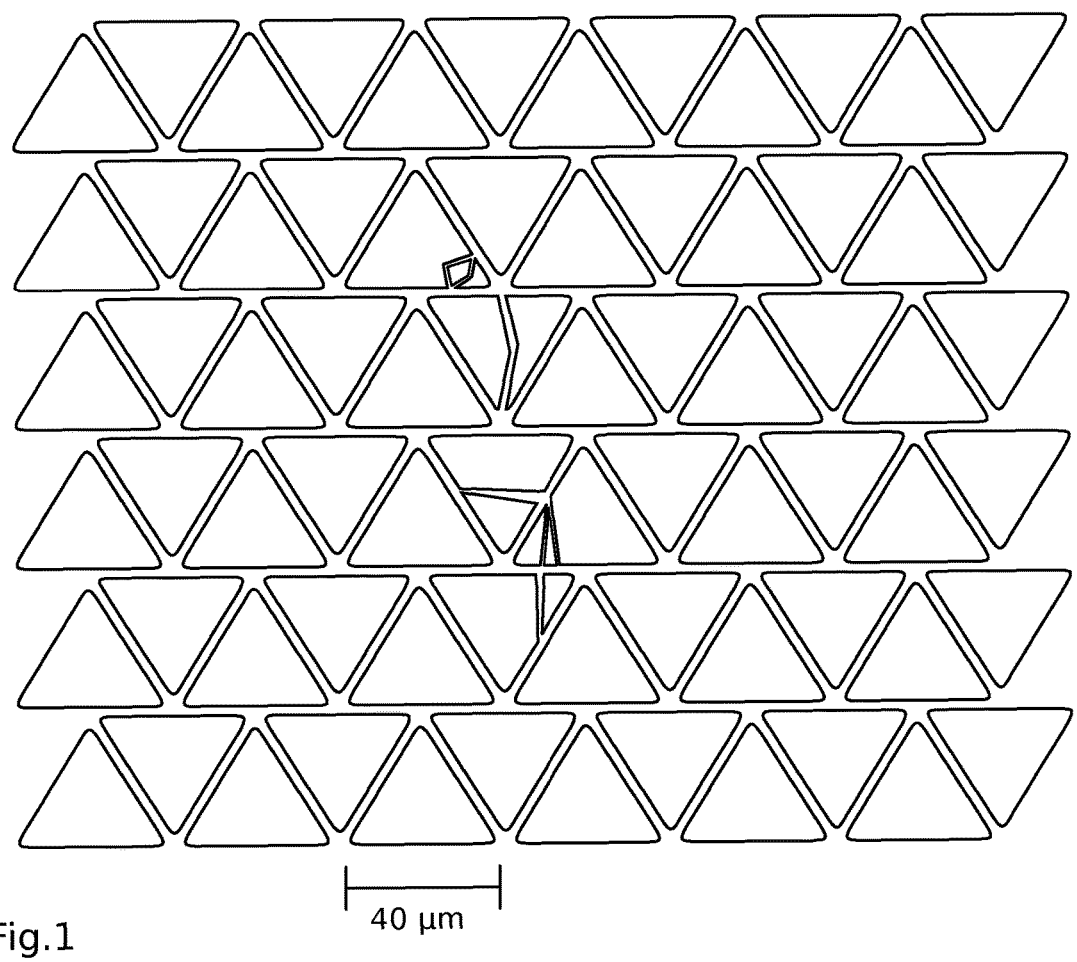
FIG. 1 is an artist's rendering of an optical micrograph of triangular gallium nitride micro-LEDs with a 40 micron (μm) base fractured during laser-liftoff.
Figure 11A:
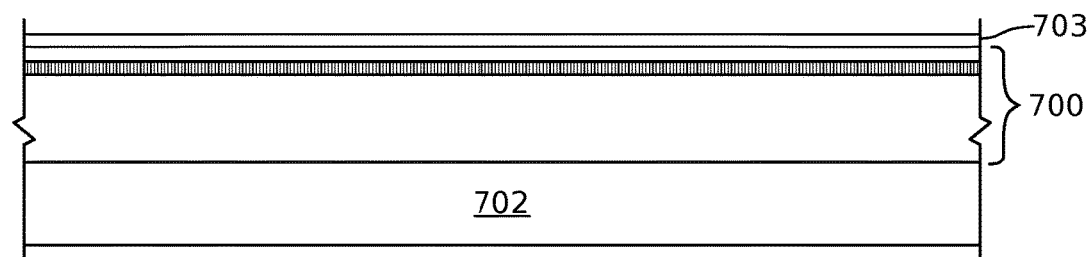
Figure 11B:
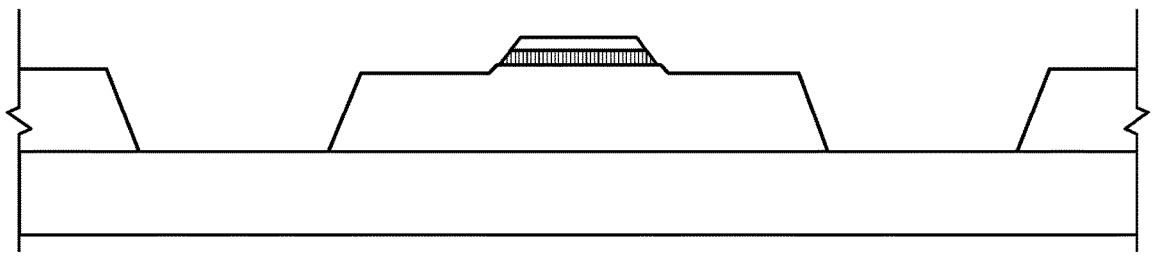
Figure 11C:
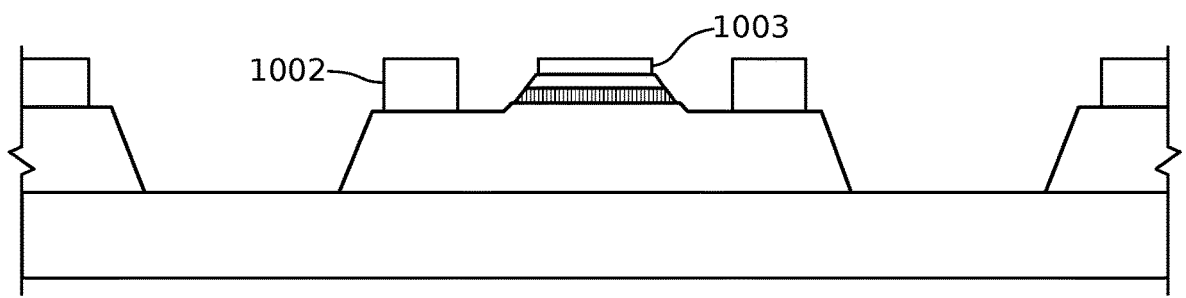
Figure 11D:
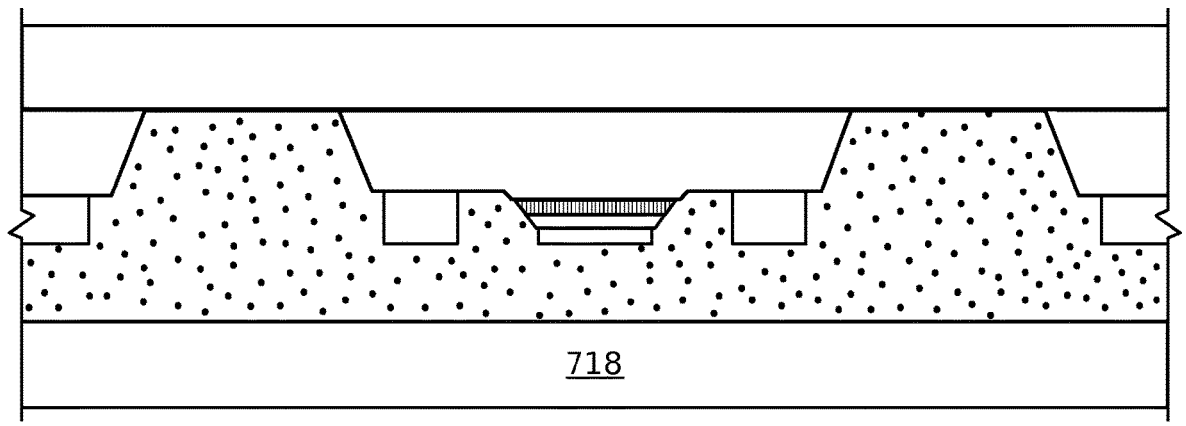
Figure 11E:
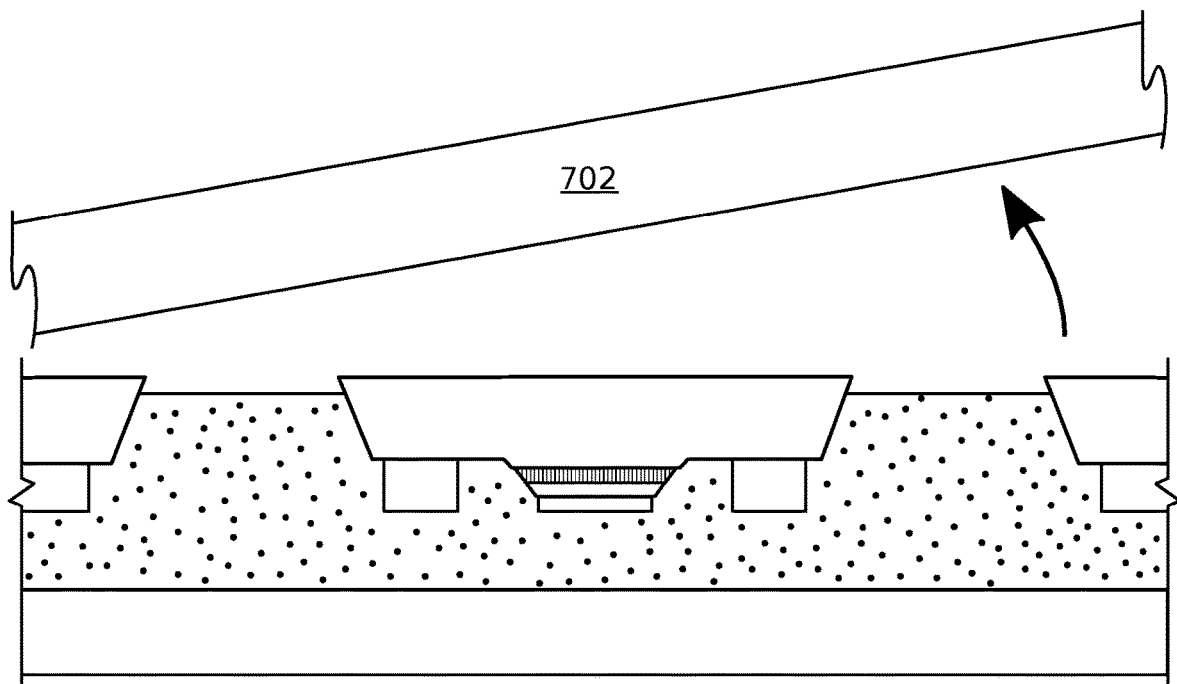
Figure 11F:
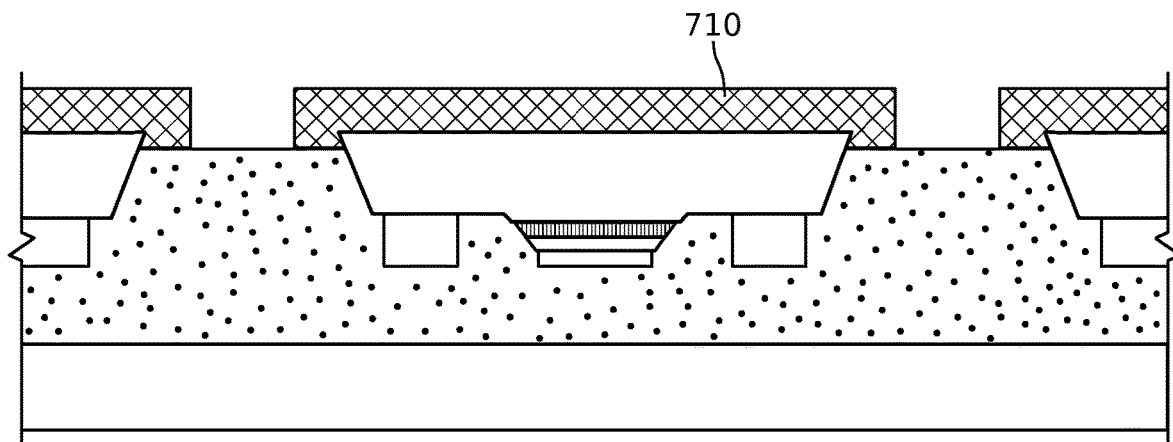
Figure 11G:
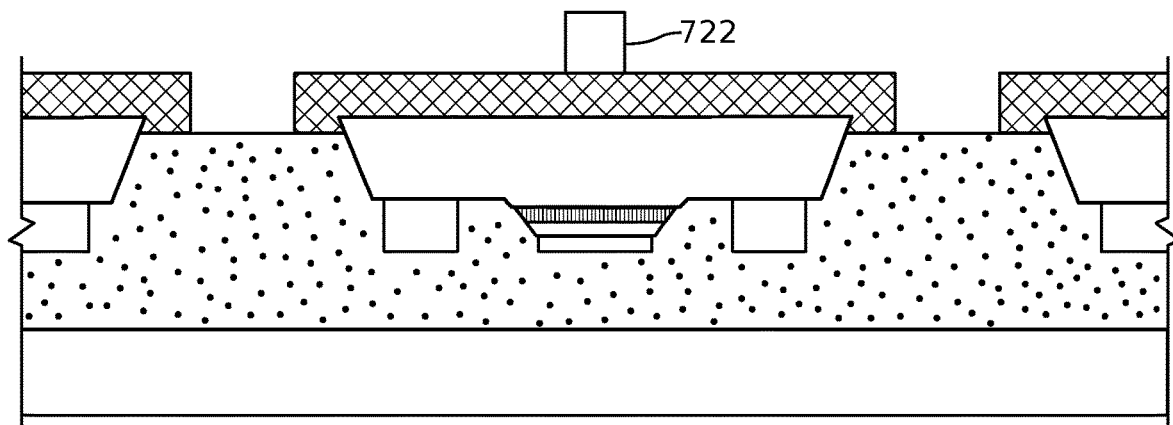
Figure 11H:
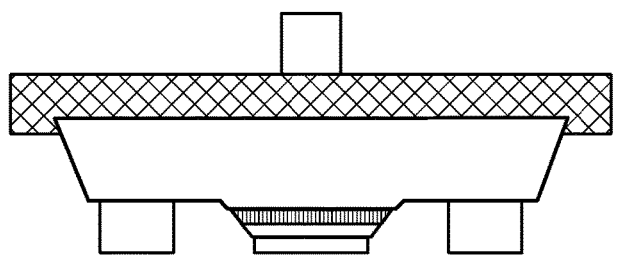

FIGS. 11A through 11I1 depict an exemplary process flow for the partial encapsulation of surface mount configuration composite microcomponents after release from a growth substrate. Although not explicitly shown, the same processing option utilizing thin GaN and described in FIGS. 8B and 8I1 can be used in this process flow. In FIG. 11A the micro-LED heterostructure 700, such as variably doped gallium nitride, is epitaxially grown on a sapphire substrate 702. The top surface may be coated with a metal stack and/or a transparent conductor like ITO 703 for electrical contact to the device anode and cathode. In FIG. 11B the micro-LED heterostructure emitter areas are etched as a mesa, and simultaneously etched to isolate and form individual micro-LEDs. In FIG. 11C electrodes 1002 and 1003 are formed. In FIG. 11D the devices are bonded to a handling substrate 718 and in FIG. 11E the devices are separated from the growth substrate 702. In FIG. 11F backside etching is optionally performed and the micro-LEDs are then coated with the patternable polymer matrix 710, which is etched. In FIG. 11G a keel 722 is optionally formed on the encapsulated LED bottom surface, and in FIG. 11I1 the handling substrate has been dissolved.

Figure 12A:
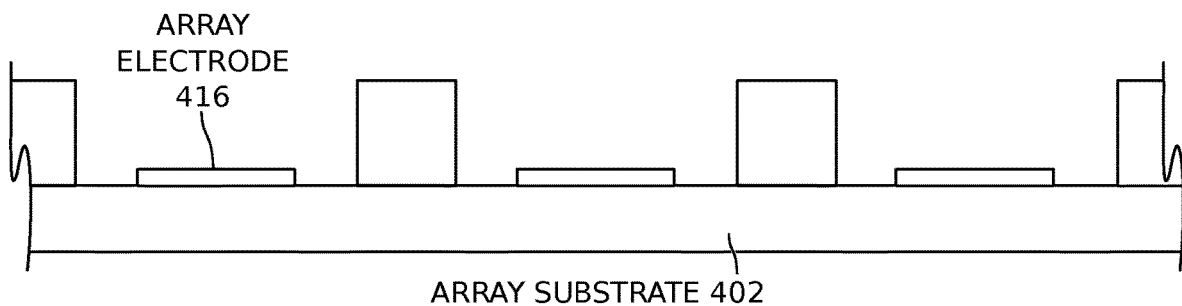
FIGS. 12A and 12B are partial cross-sectional views depicting a display substrate before and after the deposition of encapsulated vertical emissive elements.
Figure 12B:
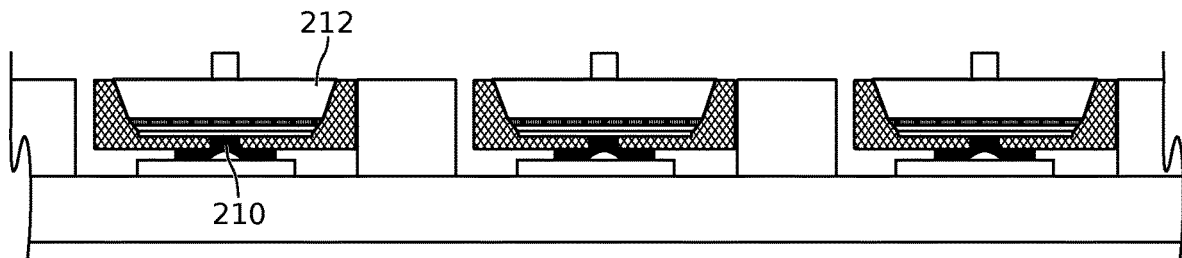

FIGS. 12A and 12B are partial cross-sectional views depicting a display substrate before and after the deposition of encapsulated vertical emissive elements. The substrate 402 includes an array of trap sites with an electrode 416 at the bottom of the trap site. The trap site is configured to accommodate the composite microcomponent in an orientation that aligns the microcomponent electrode 210 with the substrate electrode 416. The trap sites are co-optimized for assembly with the partially encapsulated micro-LED. The cathode 212 may be contacted through additional metal patterning after infill, which is not shown. As noted above, the encapsulated emissive elements and trap sites may have matching horizontal profile shapes.

Figure 13A:
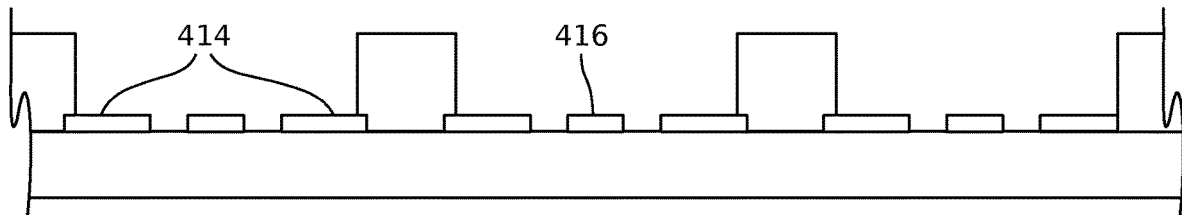
FIGS. 13A and 13B are partial cross-sectional views depicting a display substrate before and after the deposition of encapsulated surface mount emissive elements.
Figure 13B:
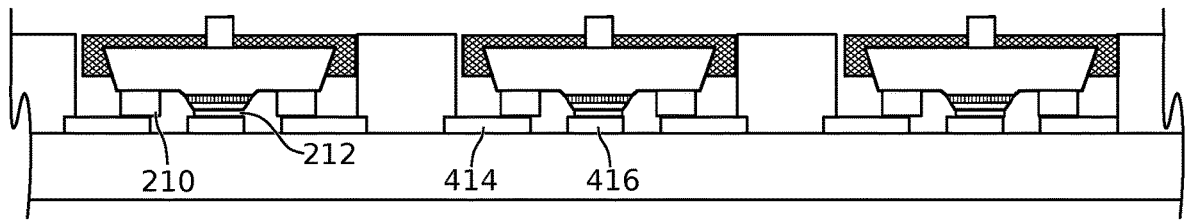

FIGS. 13A and 13B are partial cross-sectional views depicting a display substrate before and after the deposition of encapsulated surface mount emissive elements. In this aspect there are two electrical interfaces 414 and 416 in the bottom of each trap site configured to match the electrodes 210 and 212 on the flip-chip micro-LEDs. As noted above, the encapsulated emissive elements and trap sites may have matching horizontal profile shapes.

Figure 14:
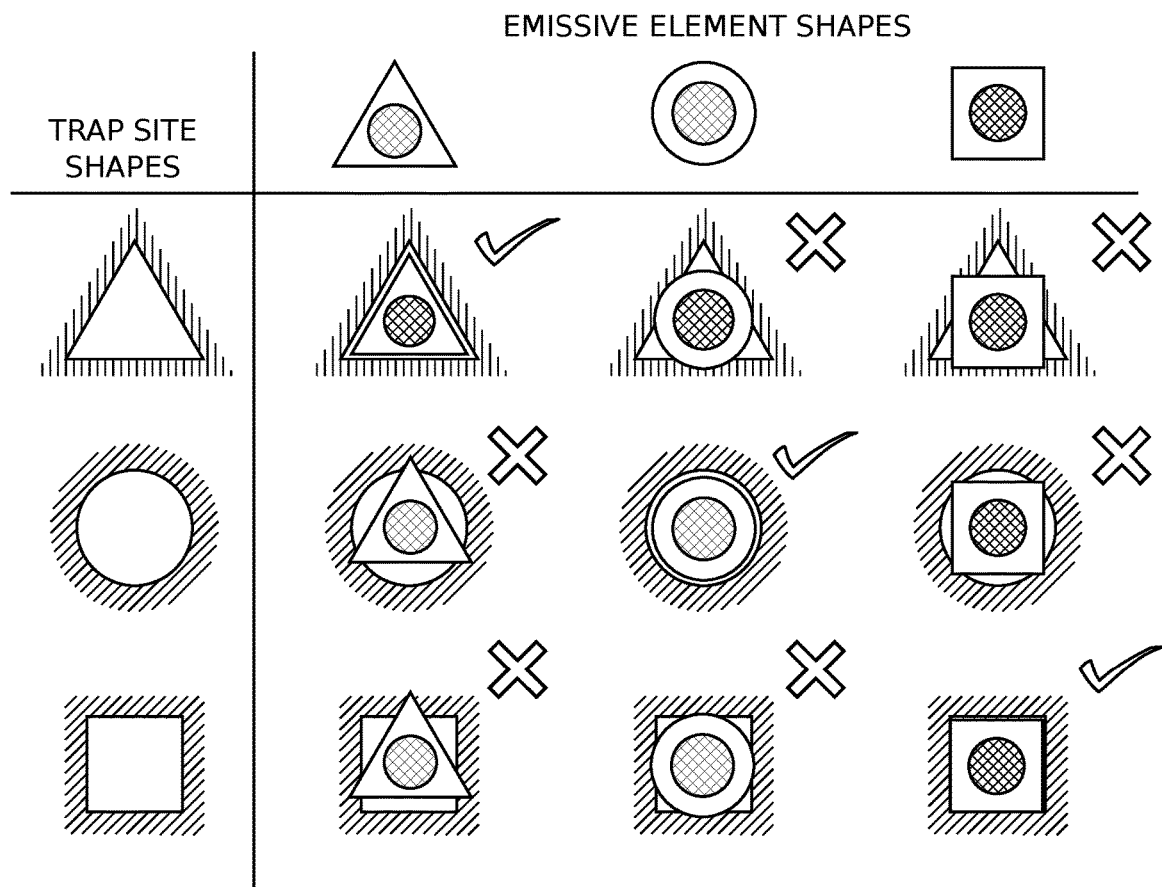
FIG. 14 is a schematic depicting the relationship between trap site shapes, encapsulant shapes, and emissive element shapes.

FIG. 14 is a schematic depicting the relationship between trap site shapes, encapsulant shapes, and emissive element shapes. In addition to the enhanced control of composite microcomponent assembly characteristics through the patterned encapsulant, a major benefit of the encapsulant is the increased fracture resistance that reduces defects and also allows for the use of more complicated shapes that would be more susceptible to fracture were the microcomponent to be a bare die. While circular disk shaped microcomponents can be captured in any orientation by circular wells, simultaneous parallel assembly of distinct microcomponents such as red, green, and blue emitters, requires mutually exclusive trapping. I.e., red emitters must only be allowed to trap in sites intended for red emission and be excluded from green or blue emitting sites; and similarly for blue and green emitters. As can be seen, triangular, square, and circular encapsulated emissive element shapes with matching trap site shapes, permit shape-selective simultaneous fluidic assembly.

In some cases, however, the microcomponents are only excluded from mismatched wells by relatively small areas with comparatively less structural strength (such as the triangular microcomponent over the circular well). Preserving the structural integrity of the microcomponent in these cases is enhanced by an excluding portion possessing sufficient mechanical strength. In this manner, fragile micro-LEDs may be assembled with shape-selective simultaneous fluidic assembly with fewer defects.

While FIG. 14 depicts the micro-LEDs inside each encapsulant shell as being identically sized, it can be seen that the use of the encapsulant permits the size and shape of the micro-LED to be varied independently from the size and shape of the encapsulant. Thus, it is possible to optimize emitter areas for chromaticity in the case of simultaneous red, green, and blue emitting micro-LED assembly while maintaining the optimum device geometry for fluidic assembly. Likewise, the use of an encapsulant enables the use of different thickness micro-LEDs, resulting in composite microcomponents with identical thicknesses—which is a substantial advantage in facilely producing emissive substrates using fluidic assembly.

Figure 15A:
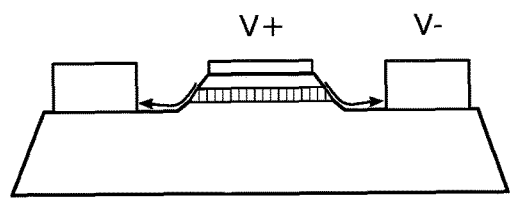
FIGS. 15A and 15B are partial cross-sectional views of a surface mount emissive element showing the use of an encapsulant as an electrical insulator.
Figure 15B:
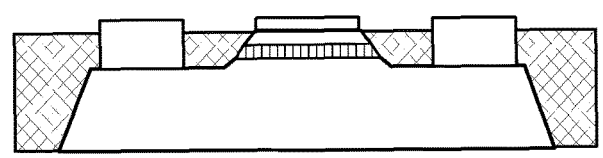

FIGS. 15A and 15B are partial cross-sectional views of a surface mount emissive element showing the use of an encapsulant as an electrical insulator. A polymer encapsulation can also be used to enhance the function of micro-LEDs in other ways, depending on the detailed properties of the material used. Photo patternable polymers are electrical insulators. So coating the LED top surface prevents electrical leakage current between cathode and anode electrodes by passivating surface damage resulting from the etch process.

Figure 16A:
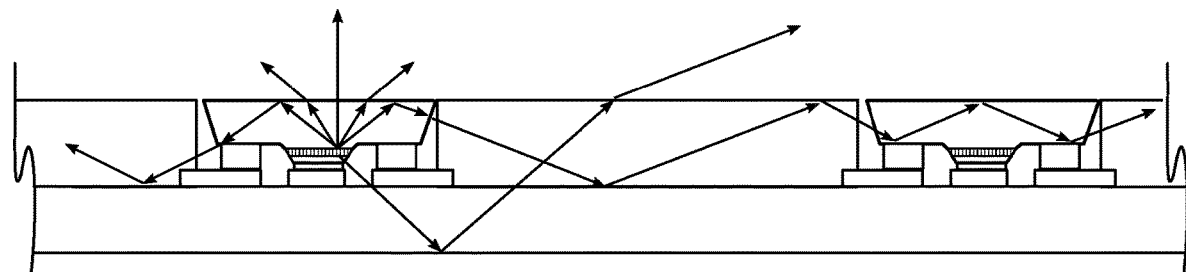
FIGS. 16A through 16C are partial cross-sectional views depicting the use of an encapsulating material in light management.
Figure 16B:
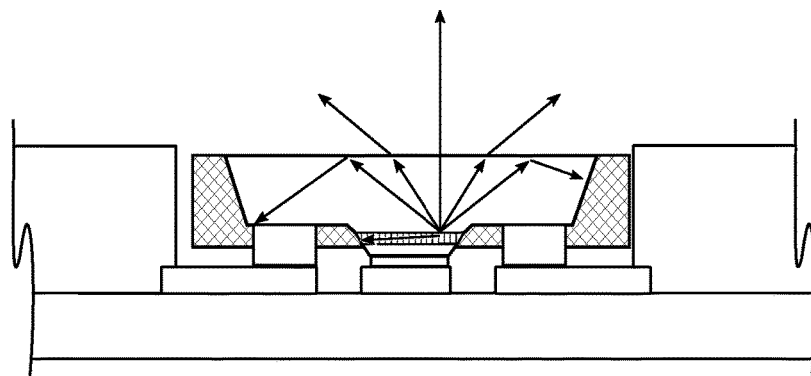
Figure 16C:
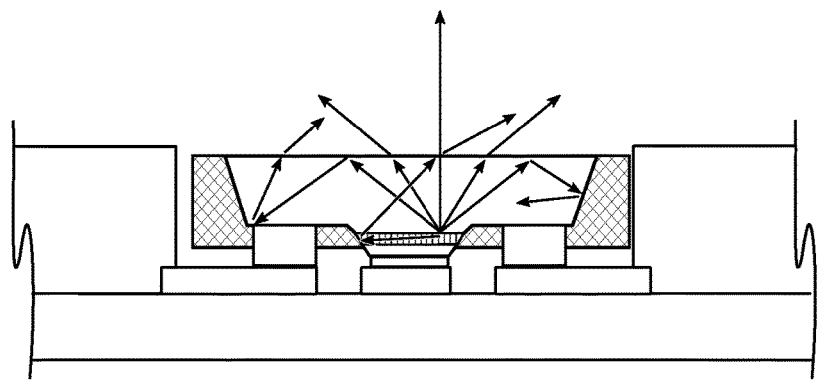

FIGS. 16A through 16C are partial cross-sectional views depicting the use of an encapsulating material in light management. It is also possible to add light management components to the polymer encapsulant to improve the performance of the micro-LED display. One of the most important factors for improving image quality is to prevent light from escaping from a pixel to contaminate an adjacent pixel, as schematically depicted in FIG. 16A. The substrate and well structures used for fluidic assembly are typically transparent so some of the light emitted by a micro-LED can be injected into these structures. Light injected into the substrate can travel a long distance laterally due to total internal reflection (TIR) before it is scattered. The undesirable result is that light from one pixel can emerge from an adjacent pixel, effectively contaminating the image of the adjacent pixel. In order to prevent this effect, the polymer encapsulant can be modified to absorb or reflect light as respectively shown in FIGS. 16B and 16C. For absorbing light, the polymer additives might be a simple absorber like carbon black or graphene oxide or it could be a more complex molecule such as a dye selected to have an absorption edge at a specific wavelength. The polymer additive selected to reflect light could be titanium oxide ($TiO_2$) or silver nanoparticles. Although not explicitly shown, the encapsulation material may include additional components to contribute functionality, such as magnetism, scattering, light extraction, wavelength conversion, or stiction. It should also be understood that in various aspects the fluidic assembly key may act to planarize emissive element top and bottom surfaces to minimize surface area effect during fluidic assembly.

Figure 17:
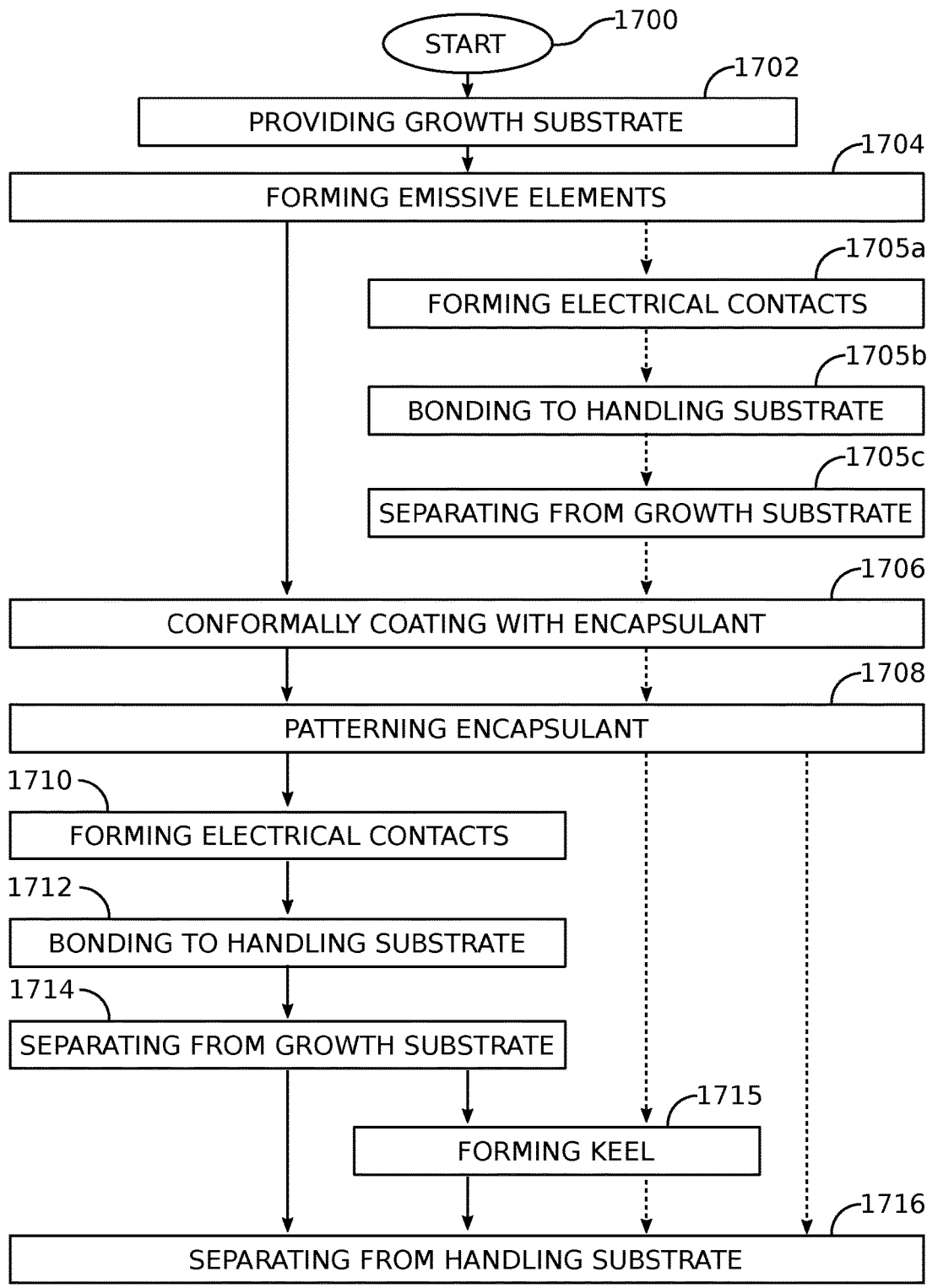
FIG. 17 is a flowchart illustrating a method for fabricating an encapsulated emissive element.

FIG. 17 is a flowchart illustrating a method for fabricating an encapsulated emissive element. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1700.

Step 1702 provides a growth substrate. Step 1704 forms a plurality of emissive elements. Each emissive element comprises a bottom surface attached to a top surface of the growth substrate, a top surface, and a profile. Step 1706 conformally coats the growth substrate top surface with an encapsulation material. As noted above, the encapsulant may be a photoresist, a polymer, a light reflective, magnetic, or a light absorbing material. Step 1708 patterns the encapsulation material to form fluidic assembly keys having a profile differing from the emissive element profiles.

In one aspect, as described in the explanation of FIGS. 7A-7I, 8A-8J, and 10A-10I, patterning the encapsulation material in Step 1708 includes forming a contact opening to each emissive element top surface. Then, Step 1710 forms a first electrical contact to each emissive element top surface. In the case of a surface mount emissive element, Step 1708 forms two contact openings and Step 1710 additionally forms a second electrical contact. Step 1712 bonds the emissive element top surfaces to a handling substrate. Step 1714 separates the emissive elements from the growth substrate, and in Step 1716 the emissive elements are separated from the handling substrate.

In another aspect, the difference in process flow is depicted using dotted connecting lines, and is as described in the explanation of FIGS. 11A through 11I. In this aspect, prior to conformally coating the growth substrate top surface with the encapsulation material, Step 1705a forms a first electrical contact to each emissive element top surface. Step 1705b bonds the emissive element top surfaces to a handling substrate, and Step 1705c separates the emissive elements from the growth substrate.

Using either method, Step 1715 optionally forms one or more fluidic assembly keels on each emissive element bottom surface before separating the emissive elements from the handling substrate in Step 1716.

In one aspect, forming the emissive element top surfaces in Step 1704 includes forming emissive element top surfaces substantially planar in a horizontal orientation, and with a horizontal profile. Then, forming the fluidic assembly key profile in Step 1708 includes forming a fluidic assembly key horizontal profile differing from the emissive element horizontal profile, as defined from a vantage orthogonal to the emissive element top surface. For example, Step 1704 may form emissive elements capable of emitting light having a first wavelength, and Step 1708 may form a first fluidic assembly key horizontal profile corresponding to the first wavelength. In addition, Step 1704 may form emissive element horizontal profiles from a plurality of differing horizontally oriented shapes, where each horizontally oriented shape is associated with a different wavelength of emissive element light emission. Even if the emissive element profiles are necessarily different, Step 1704 may form a plurality of emissive element types (not necessarily simultaneously), with each type capable of emitting light at a different wavelength. Then, Step 1708 forms fluidic assembly key profiles from a plurality of different horizontally oriented shapes, with each horizontally oriented shape associated with a corresponding emissive element wavelength of light emission. Alternatively, Step 1708 forms fluidic assembly key shapes with a plurality of different vertically oriented shapes, with each vertically oriented shape associated with a corresponding emissive element wavelength of light emission. As noted above, a horizontal profile is defined from a vantage orthogonal to the emissive element top surface and a vertical profile is defined from the vantage orthogonal to an emissive element sidewall.

In addition to the fluidic assembly keys optionally being formed with different vertical profiles, Step 1704 may form emissive elements having a vertical profile, and Step 1708 may form fluidic assembly key vertical profiles differing from the emissive element vertical profiles. For example, Step 1708 may form fluidic assembly keys with a vertical profile having a slope formed between the fluidic assembly key bottom surface, which is aligned with the emissive element bottom surface, and the fluidic assembly key top surface aligned with the emissive element top surface. The fluidic assembly key top surface width may be greater than or equal to the fluidic assembly key bottom surface width. Likewise, the emissive elements formed in Step 1704 may have top and bottom surfaces that are substantially planar in a horizontal orientation, with emissive element sidewalls forming a vertically oriented slope between an emissive element top surface width less than or equal to than an emissive element bottom surface width.

Thus, as noted above, Step 1704 may form emissive elements from differing horizontal or vertically oriented shapes, where each different emissive element shape is associated with a different wavelength of light emission. In one aspect, the vertically oriented shapes are defined by a thickness between the emissive element top and bottom surfaces. Thus, Step 1704 may form first emissive elements having a first thickness between its top and bottom surfaces, associated with a first wavelength of emissive element light emission. Step 1704 may also form second emissive elements, not necessarily as the first emissive elements are being formed, having a second thickness between its top and bottom surfaces, less than the first thickness, associated with a second wavelength of emissive element light emission. Then, Step 1708 forms first fluidic assembly key encapsulating the first emissive element top and bottom surfaces to form an overall encapsulated emissive element third thickness. Step 1708 also forms second fluidic assembly keys encapsulating the second emissive element top and bottom surfaces to form the overall encapsulated emissive element third thickness.

An encapsulated emissive element, a display fabricated using encapsulated emissive elements, and an associated encapsulated emissive element fabrication method have been provided. Examples of particular materials, dimensions, profiles, and circuit layouts have been presented to illustrate the invention. Although emissive elements, particularly LEDs, have been presented, the methods described herein are also applicable to other two-terminal devices such as photodiodes, thermistors, pressure sensors, and piezoelectric devices, which may also be encapsulated. Other variations and embodiments of the invention will occur to those skilled in the art.

We claim:

1. A method for fabricating an encapsulated emissive element, the method comprising:
   providing an emissive element heterostructure on a growth substrate;
   forming a plurality of emissive elements, each emissive element comprising a bottom surface attached to a top surface of the growth substrate, and further comprising a top surface, sidewalls, and a vertical profile, where a vertical profile is defined from a vantage orthogonal to the emissive element sidewalls;
   coating the emissive elements with an encapsulation material; and,
   patterning the encapsulation material to form fluidic assembly keys vertical profiles differing from the emissive element vertical profiles, having a slope formed between a fluidic assembly key bottom surface, aligned with the emissive element bottom surface, and a fluidic assembly key top surface aligned with the emissive element top surface, with the fluidic assembly key top surface width being greater than or equal to the fluidic assembly key bottom surface width.

2. The method of claim 1 wherein coating the emissive elements includes coating the emissive element top surfaces;
   wherein patterning the encapsulation material includes forming a contact opening to each emissive element top surface;
   the method further comprising:
   forming a first electrical contact to each emissive element top surface;
   bonding the emissive element top surfaces to a handling substrate;
   separating the emissive elements from the growth substrate; and,
   separating the emissive elements from the handling substrate.

3. The method of claim 2 wherein patterning the encapsulation material to form the contact opening includes patterning to form two contact openings to each emissive element top surface; and,
   wherein forming the first electrical contact includes forming the first electrical contact and a second electrical contact to each emissive element top surface.

4. The method of claim 1 further comprising:
   forming a first electrical contact to each emissive element top surface;
   bonding the emissive element top surfaces to a handling substrate;
   separating the emissive elements from the growth substrate; and,
   wherein coating the emissive elements includes coating the emissive element bottom surfaces.

5. The method of claim 1 further comprising:
   forming a fluidic assembly keel on each emissive element bottom surface.

6. The method of claim 1 wherein forming the emissive element top surfaces includes forming emissive element top surfaces substantially planar in a horizontal orientation, and with a horizontal profile;
   wherein forming the fluidic assembly key vertical profile includes forming a fluidic assembly key horizontal profile differing from the emissive element horizontal profile, as defined from a vantage orthogonal to the emissive element top surface.

7. The method of claim 6 wherein forming the emissive elements includes forming emissive elements capable of emitting light having a first wavelength; and,
   wherein forming the fluidic assembly key horizontal profile includes forming a first fluidic assembly key horizontal profile corresponding to the first wavelength.

8. The method of claim 6 wherein providing the emissive element heterostructure on the growth substrate includes providing a plurality of emissive element heterostructures on a corresponding plurality of growth substrates, where each emissive element heterostructure is associated with a different wavelength of light emission;
   wherein forming the emissive elements includes forming emissive element horizontal profiles from a plurality of differing horizontally oriented shapes, where each horizontally oriented shape is associated with a corresponding emissive element heterostructure.

9. The method of claim 1 wherein providing the emissive element heterostructure on the growth substrate includes providing a plurality of emissive element heterostructures on a corresponding plurality of growth substrates, where each emissive element heterostructure is associated with a different wavelength of light emission;
   wherein forming the emissive elements includes forming a plurality of emissive element types, each type associated with a corresponding emissive element heterostructure;
   wherein forming the fluidic assembly key vertical profile includes forming a plurality of differing vertical thicknesses between the emissive element top and bottom surfaces, with each vertical thickness associated with a corresponding emissive element wavelength of light emission.

10. The method of claim 1 wherein forming the emissive elements includes forming emissive element top and bottom surfaces that are substantially planar in a horizontal orientation, with emissive element sidewalls forming a vertically oriented slope between an emissive element top surface width less than or equal to an emissive element bottom surface width.

11. The method of claim 1 wherein forming the fluidic assembly key includes forming the fluidic assembly key from a material selected from the group consisting of photoresist, a polymer, a light reflective material, magnetic material, and a light absorbing material.

12. The method of claim 1 wherein providing the emissive element heterostructure on the growth substrate includes providing a first emissive element heterostructure on a first growth substrate and a second emissive element heterostructure on a second growth substrate, where each emissive element heterostructure is associated with a different wavelength of light emission;
   wherein forming the emissive elements includes:

forming first emissive elements from the first emissive element heterostructure, having a first thickness between its top and bottom surfaces associated with a first wavelength of emissive element light emission;

forming a second emissive element from the second emissive element heterostructure, having a second thickness between its top and bottom surfaces, less than the first thickness, associated with a second wavelength of emissive element light emission;

wherein forming the fluidic assembly keys includes:

forming a first fluidic assembly key encapsulating the first emissive element top and bottom surfaces to form an overall encapsulated emissive element third thickness; and, forming a second fluidic assembly key encapsulating the second emissive element top and bottom surfaces to form the overall encapsulated emissive element third thickness.

13. A method for fabricating an encapsulated emissive element, the method comprising:

providing an emissive element heterostructure on a growth substrate;

forming a plurality of emissive elements, each emissive element comprising a bottom surface attached to a top surface of the growth substrate, and further comprising a top surface and a profile;

coating the emissive elements with an encapsulation material;

patterning the encapsulation material to form fluidic assembly keys having a profile differing from the emissive element profiles; and, in a process performed in a sequence selected from the group consisting of before patterning the encapsulation material or after patterning the encapsulation material, forming an electrically non-conductive fluidic assembly keel on each emissive element bottom surface.

14. The method of claim 13 wherein patterning the encapsulation material includes patterning to form two contact openings to each emissive element top surface; and, the method further comprising:

forming a first electrical contact and a second electrical contact to each emissive element top surface.

15. The method of claim 13 wherein forming the emissive element top surfaces includes forming emissive element top surfaces substantially planar in a horizontal orientation, and with a horizontal profile;

wherein forming the fluidic assembly key profile includes forming a fluidic assembly key horizontal profile differing from the emissive element horizontal profile, as defined from a vantage orthogonal to the emissive element top surface.

16. The method of claim 15 wherein providing the emissive element heterostructure on the growth substrate includes providing a plurality of emissive element heterostructures on a corresponding plurality of growth substrates, where each emissive element heterostructure is associated with a different wavelength of light emission;

wherein forming the emissive elements includes forming a plurality of emissive element types, each type associated with a corresponding emissive element heterostructure;

wherein forming the fluidic assembly key profiles includes forming of a plurality of different horizontally oriented shapes, with each horizontally oriented shape associated with a corresponding emissive element wavelength of light emission, wherein a horizontal shape is defined from a vantage orthogonal to the emissive element top.

17. A method for fabricating an encapsulated emissive element, the method comprising:

providing a first emissive element heterostructure on a first growth substrate and a second emissive element heterostructure on a second growth substrate, where each emissive element heterostructure is associated with a different wavelength of light emission;

forming a plurality of emissive elements, each emissive element comprising a bottom surface attached to a top surface of the growth substrate, and further comprising a top surface and a profile, with first emissive elements formed from the first emissive element heterostructure having a first thickness between their top and bottom surfaces, associated with a first wavelength of emissive element light emission, and second emissive elements formed from the second emissive element heterostructure having a second thickness between their top and bottom surfaces, less than the first thickness, associated with a second wavelength of emissive element light emission;

coating the emissive elements with an encapsulation material; and, patterning the encapsulation material to form fluidic assembly keys having a profile differing from the emissive element profiles, with first fluidic assembly keys encapsulating first emissive element top and bottom surfaces to form an overall encapsulated emissive element third thickness, and second fluidic assembly keys encapsulating second emissive element top and bottom surfaces to form the overall encapsulated emissive element third thickness.

18. The method of claim 17 wherein patterning the encapsulation material includes patterning to form two contact openings to each emissive element top surface; and, the method further comprising:

forming a first electrical contact and a second electrical contact to each emissive element top surface.

19. The method of claim 17 wherein forming the emissive element profiles includes forming a profile selected from a group consisting of differing horizontally oriented shapes, as defined from a vantage orthogonal to the emissive element top surface, or differing vertical thicknesses between the emissive element top and bottom surfaces, where each emissive element profile is associated with a different wavelength of emissive element light emission.

* * * * *